United States Patent

Kamihara et al.

[11] Patent Number: 5,695,274
[45] Date of Patent: Dec. 9, 1997

[54] ILLUMINATING OPTICAL SYSTEM FOR USE IN PROJECTING EXPOSURE DEVICE

[75] Inventors: Yasuhiro Kamihara; Hitoshi Ohashi, both of Hachioji, Japan

[73] Assignee: Olympus Optical Co., Ltd., Tokyo, Japan

[21] Appl. No.: 408,819

[22] Filed: Mar. 23, 1995

[51] Int. Cl.[6] .................................................... F21V 7/04
[52] U.S. Cl. ......................... 362/268; 362/331; 362/339
[58] Field of Search ........................... 362/268, 331, 362/339

[56] References Cited

U.S. PATENT DOCUMENTS

| | | | |
|---|---|---|---|
| 4,619,508 | 10/1986 | Shibuya et al. | 362/268 |
| 4,851,978 | 7/1989 | Ichihara | 362/268 |
| 4,939,630 | 7/1990 | Kikuchi et al. | 362/268 |
| 5,016,149 | 5/1991 | Tanaka et al. | 362/268 |
| 5,237,367 | 8/1993 | Kudo | 362/268 |
| 5,245,384 | 9/1993 | Mori | 362/268 |

FOREIGN PATENT DOCUMENTS

| | | |
|---|---|---|
| 6321171B2 | 1/1981 | Japan. |
| 61-91662A | 5/1986 | Japan. |
| 21109A | 1/1990 | Japan. |
| 4225357A | 8/1992 | Japan. |
| 4267515A | 9/1992 | Japan. |

*Primary Examiner*—Alfred Basichas
*Attorney, Agent, or Firm*—Watson Cole Stevens Davis, P.L.L.C.

[57] ABSTRACT

An illuminating optical system for use in a projection exposure device with high utilization efficiency of the light from the light source and capable of easily realizing with simple construction is disclosed. The system comprises a light source, a light flux separating optical system for separating a light flux from the light source, a condenser optical system for leading the light flux separated by the light flux separating optical system on a reticle, and a diffraction optical unit included in the light flux separating optical system and having a linear grating pattern for separating the light flux from the light source into four.

30 Claims, 33 Drawing Sheets

FIG._2a   FIG._2b   FIG._2c
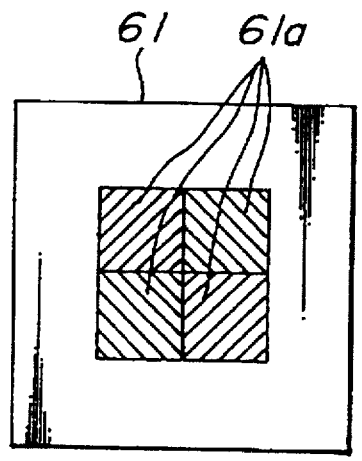
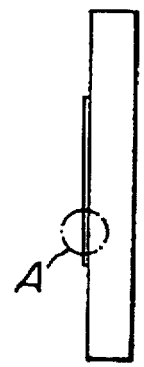
FIG._3
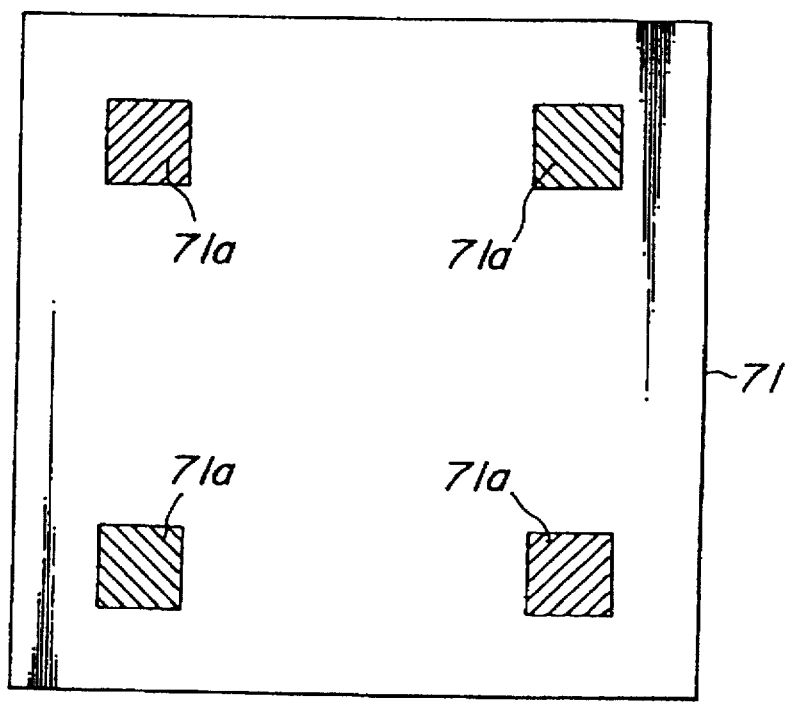

FIG_4
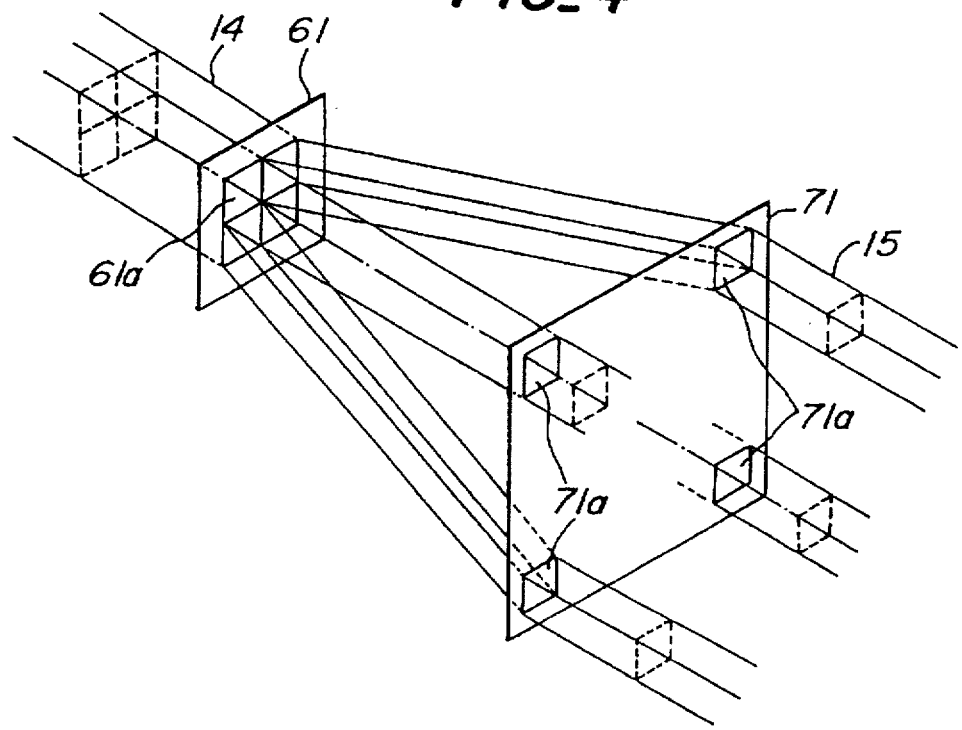
FIG_5
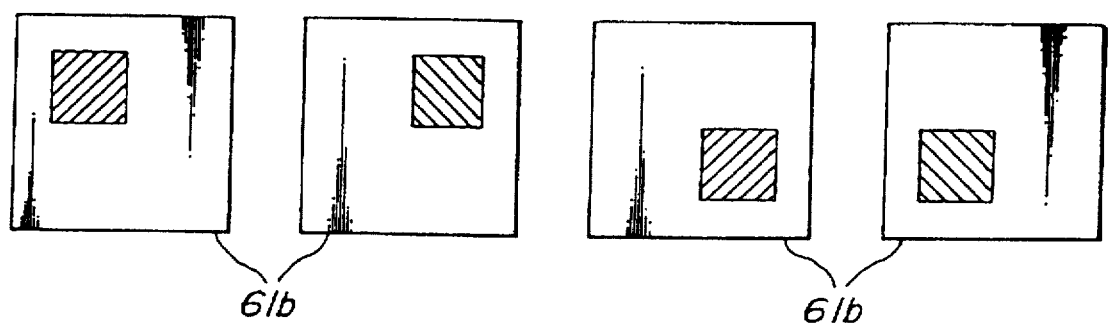

FIG_6a
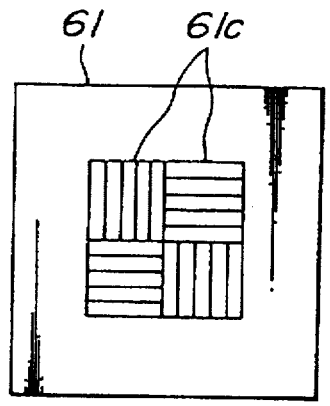
FIG_6b
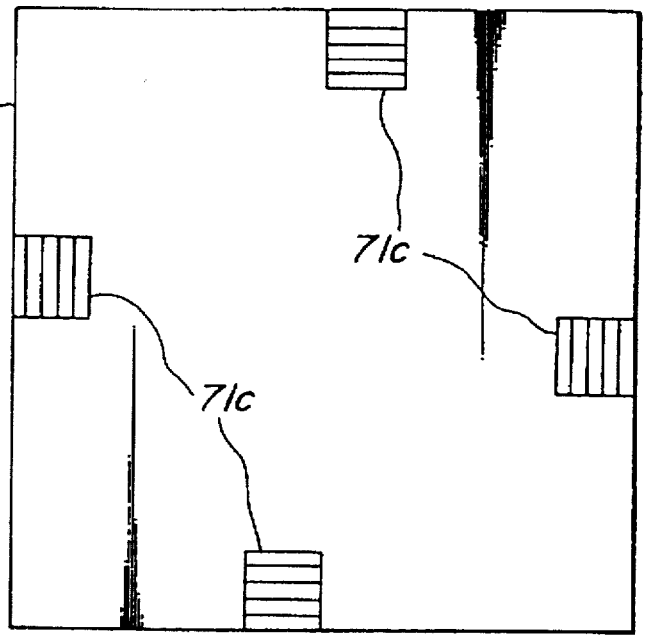
FIG_7a
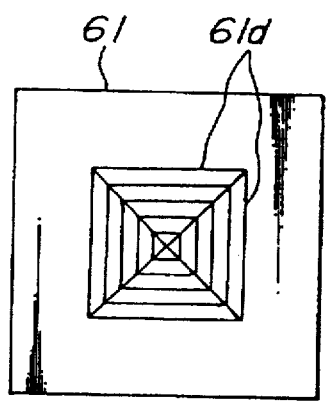
FIG_7b
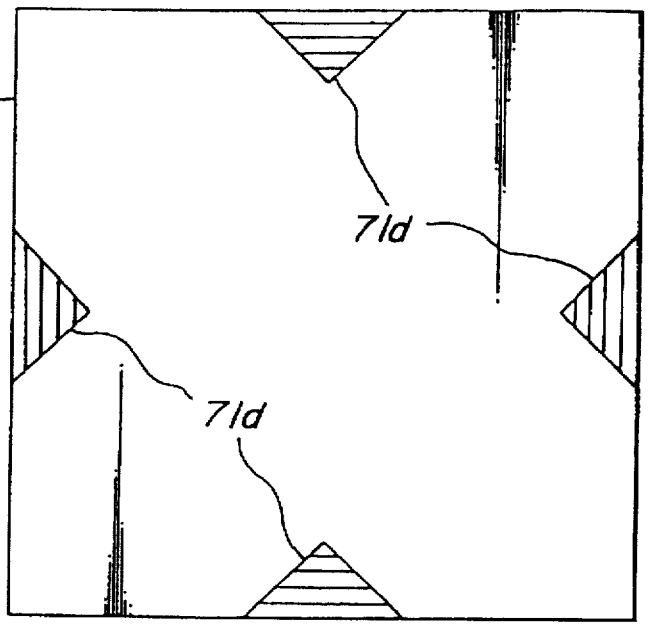

FIG_8
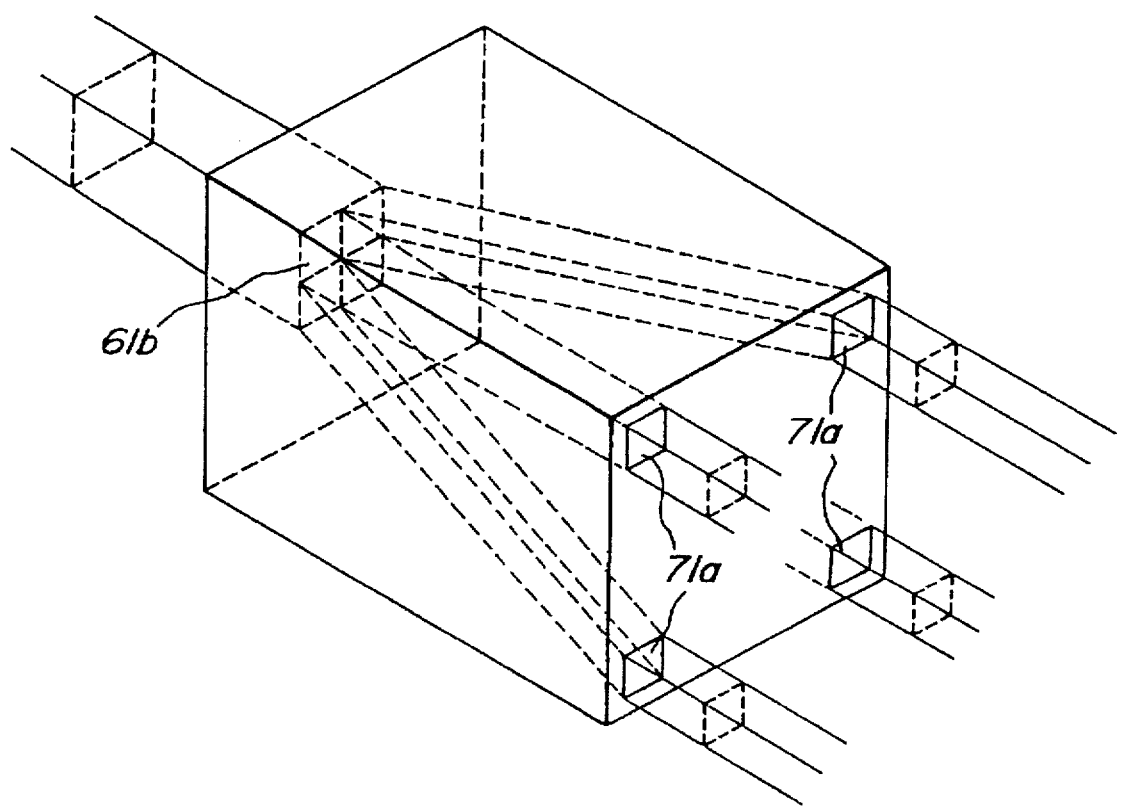

FIG_10a  FIG_10b  FIG_10c
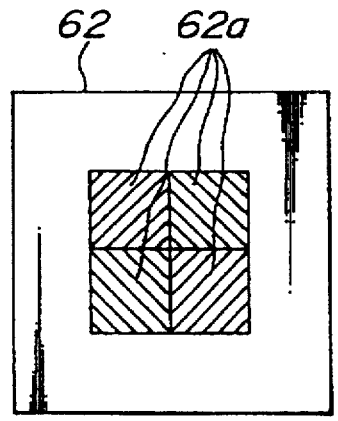
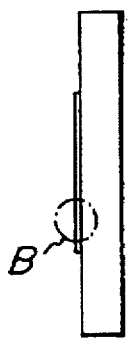
FIG_11
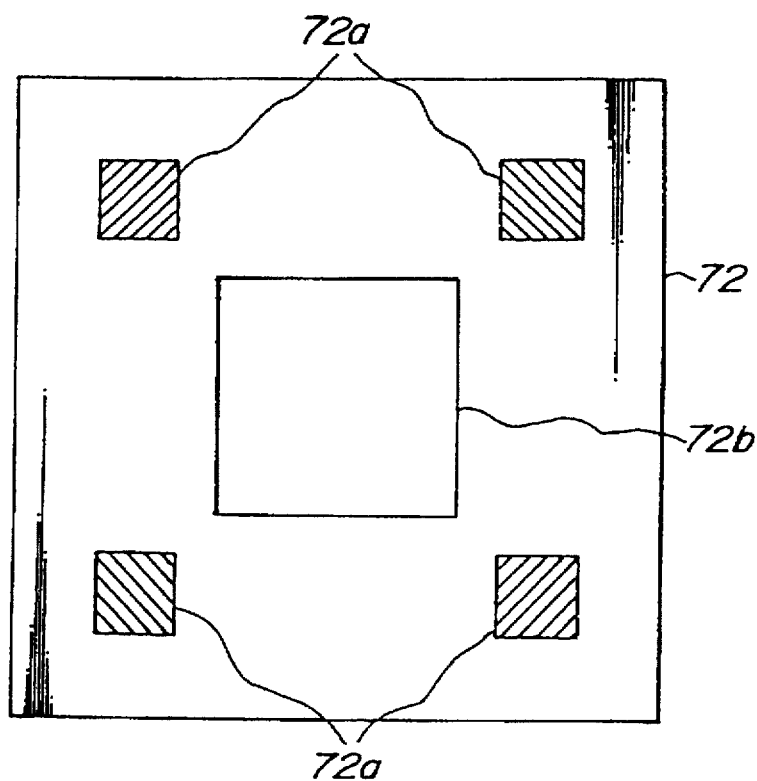

FIG_12
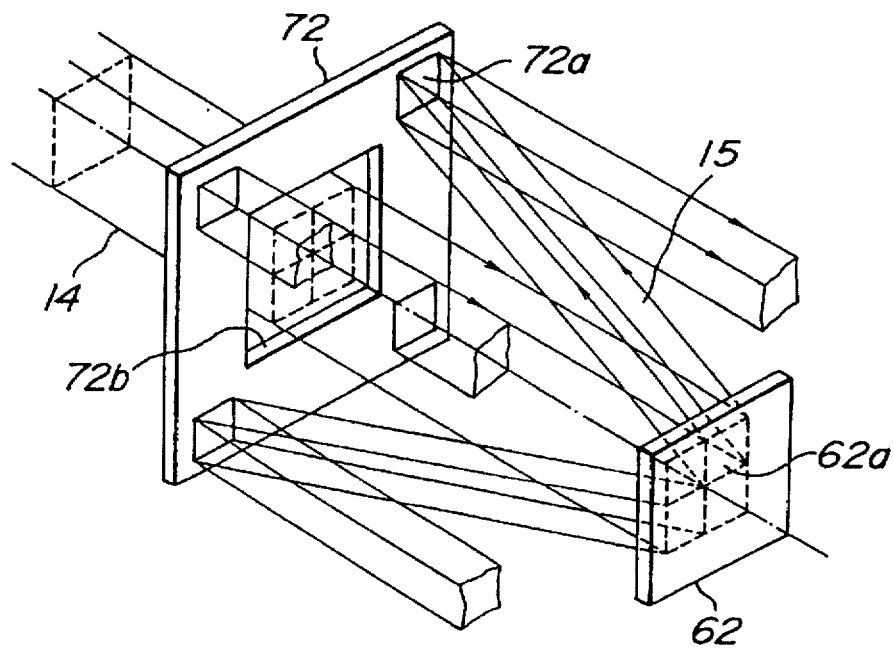
FIG_13
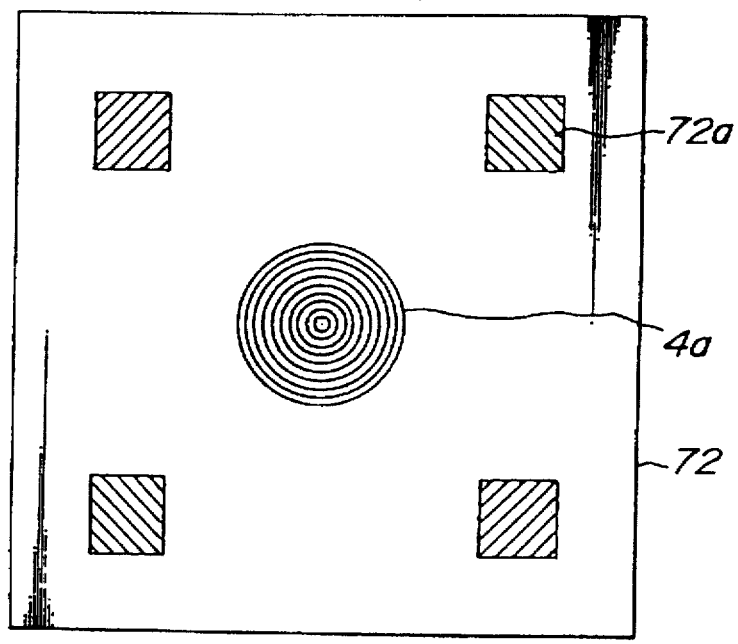

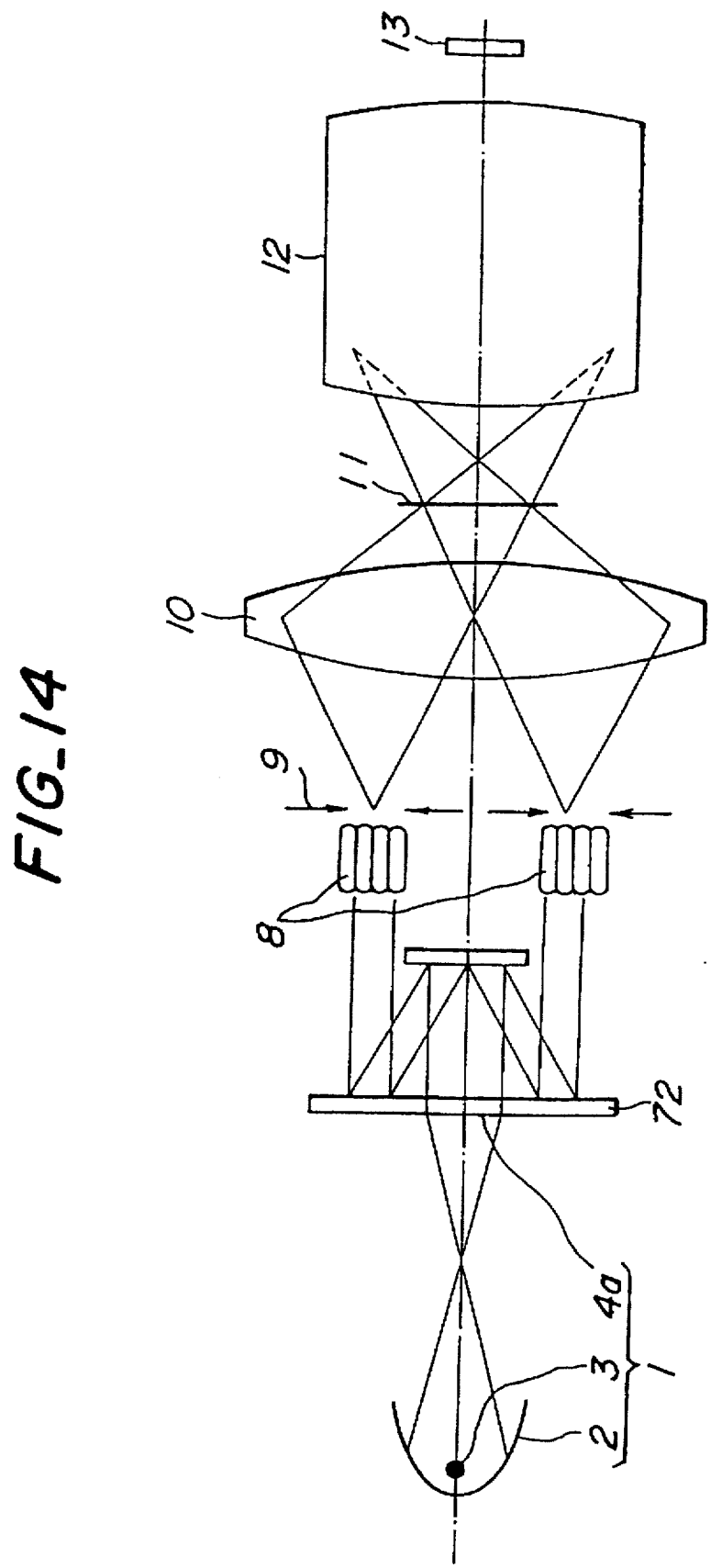
FIG_14

FIG_16a
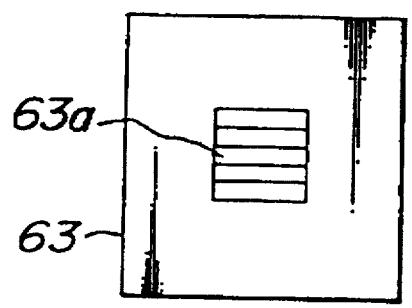
FIG_16b
FIG_17a
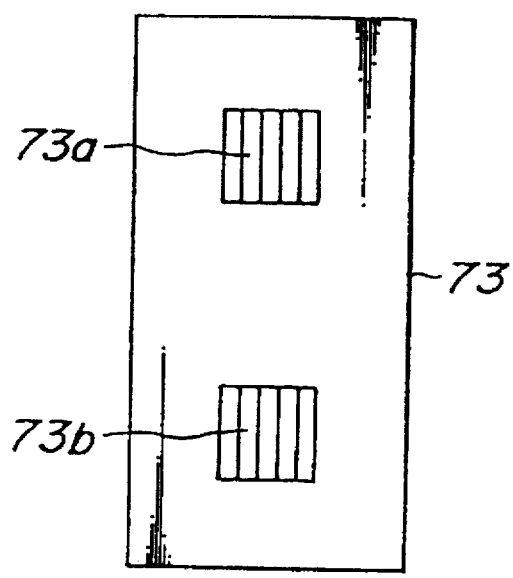
FIG_17b

FIG_19
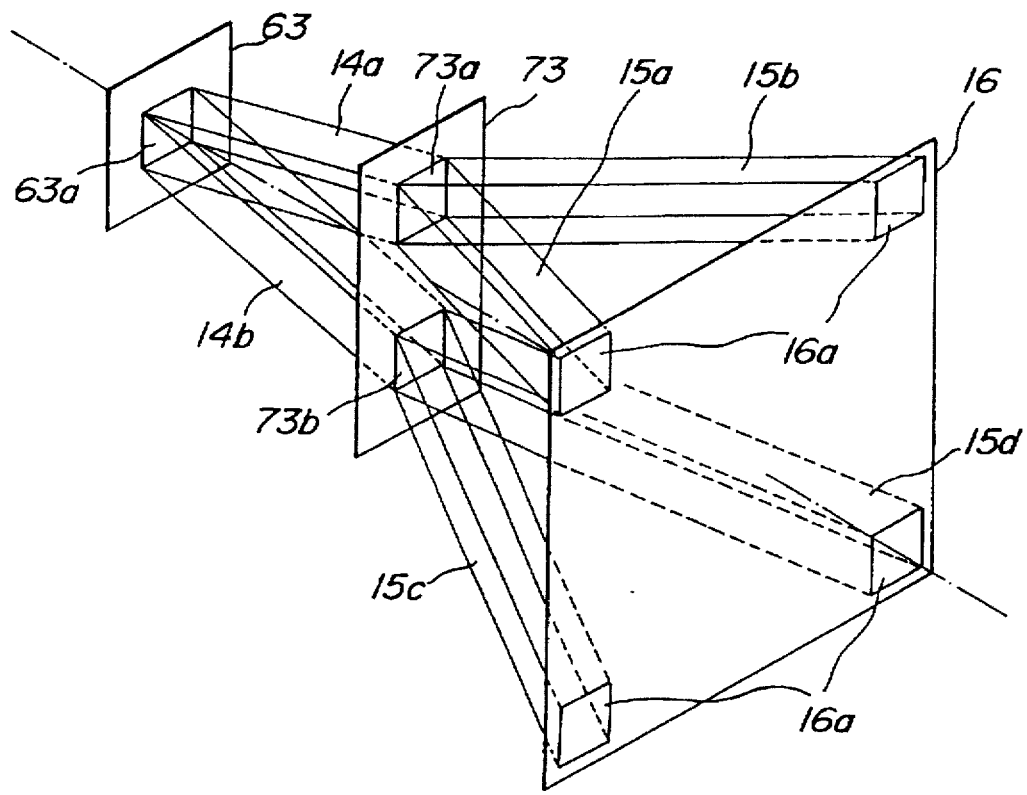
FIG_20
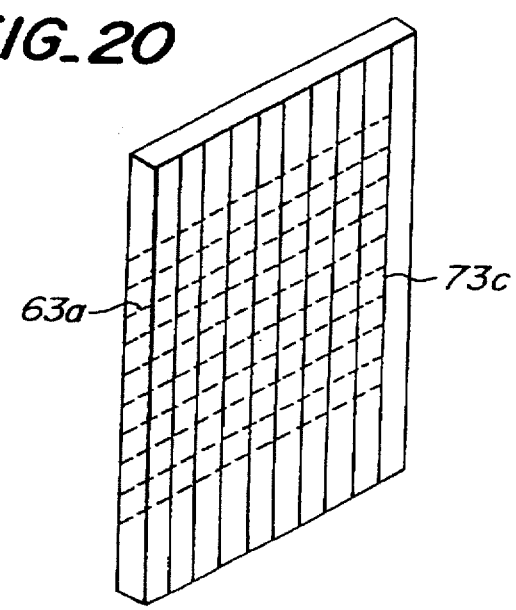

FIG_22a
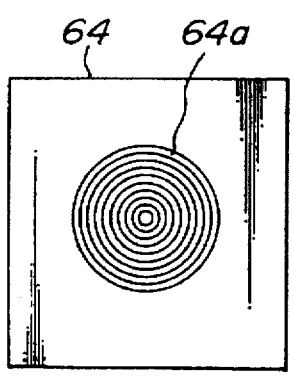
FIG_22b
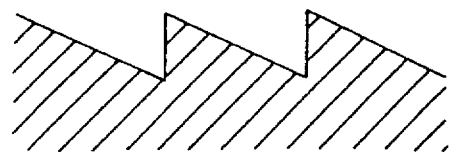
FIG_23a
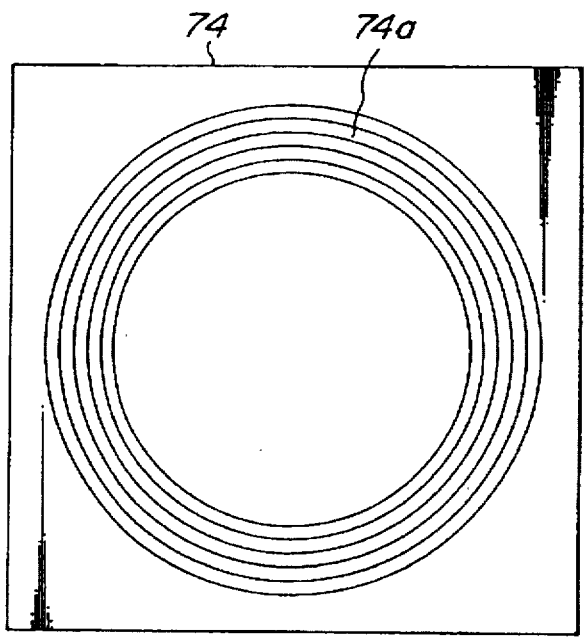
FIG_23b
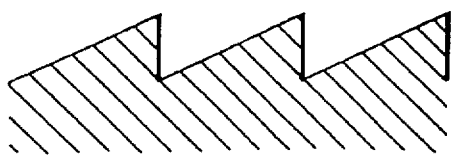

FIG_27a
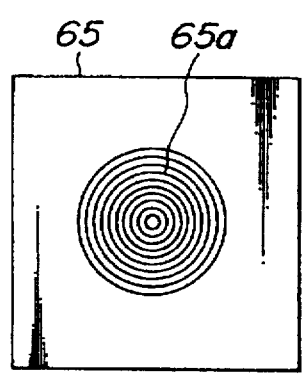
FIG_27b
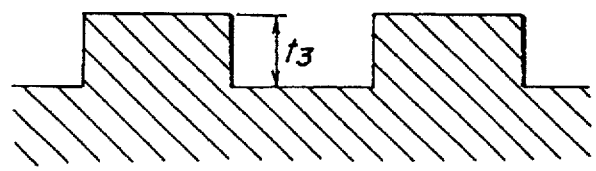
FIG_28a
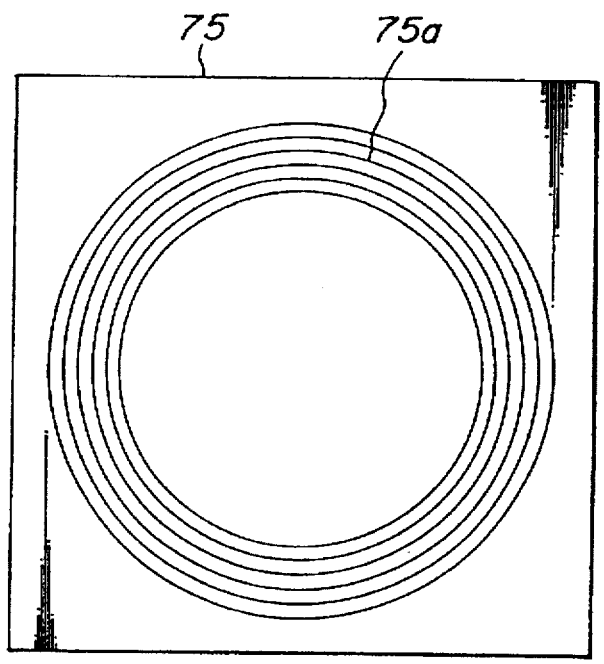
FIG_28b
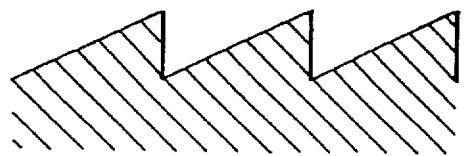

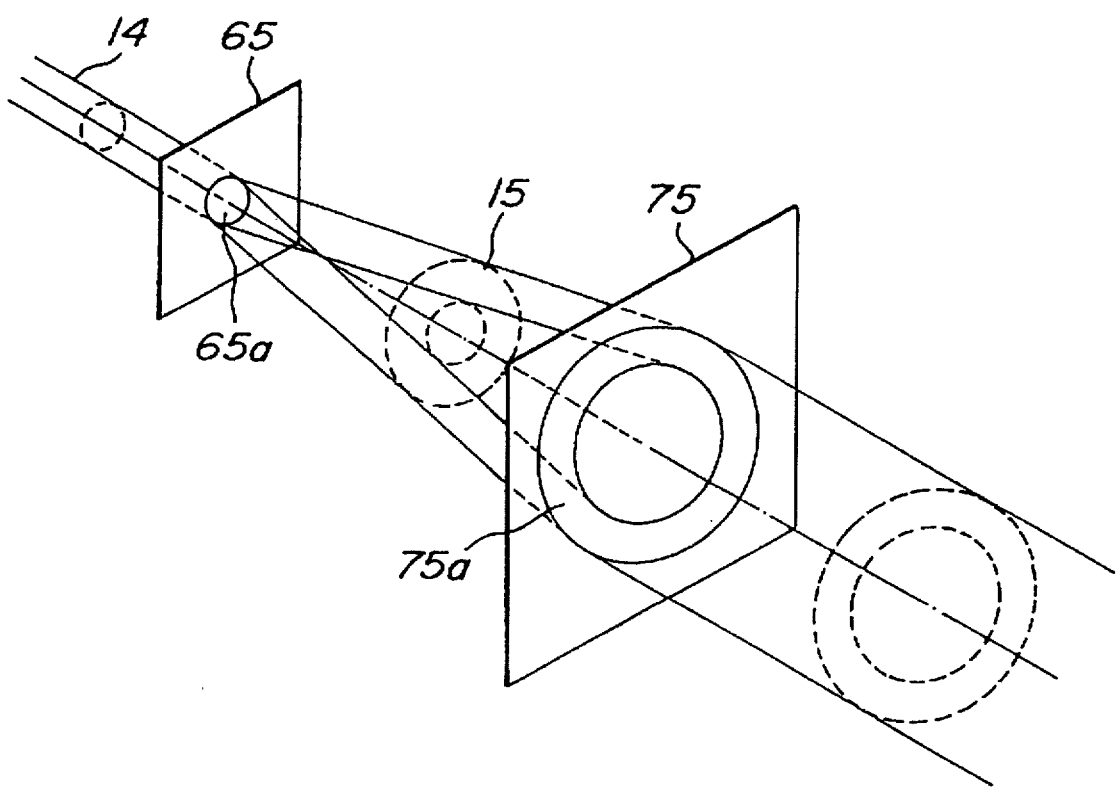
FIG_29

FIG_31a
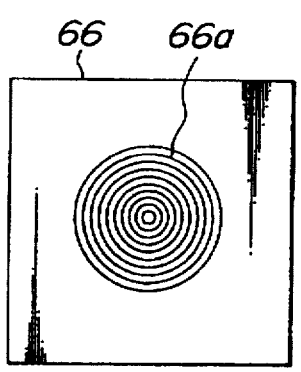
FIG_31b
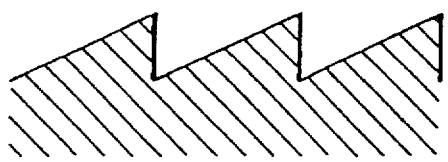
FIG_32a
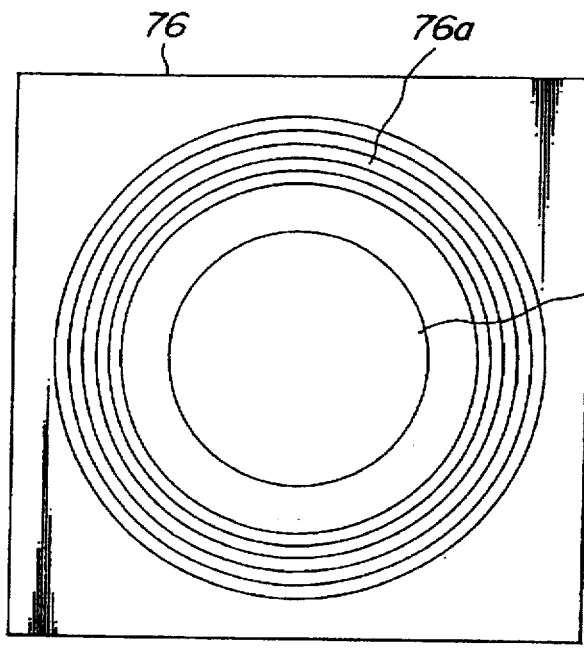
FIG_32b
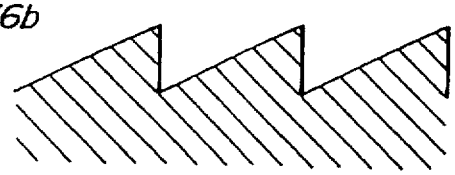

FIG_33
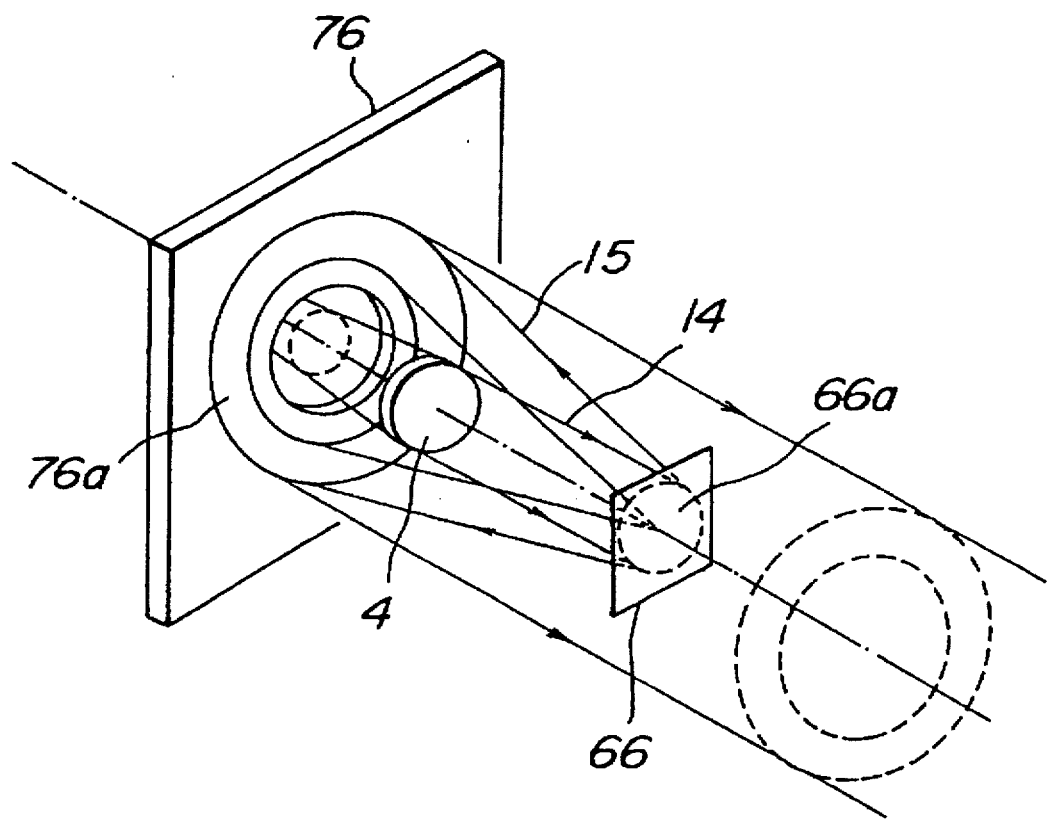

FIG_35a
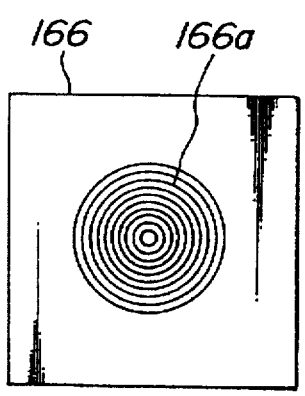
FIG_35b
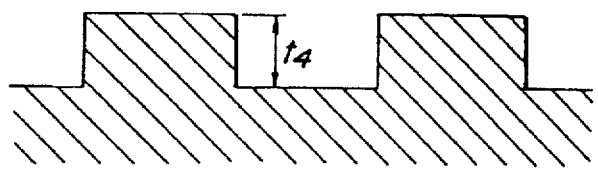
FIG_36a
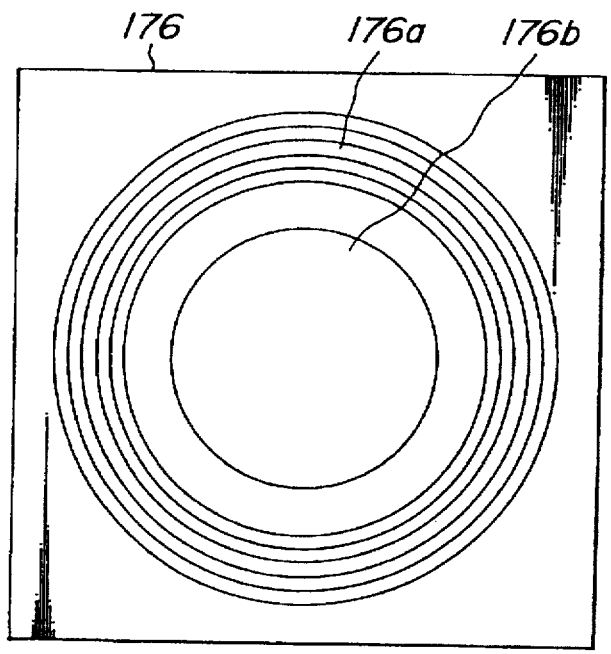
FIG_36b
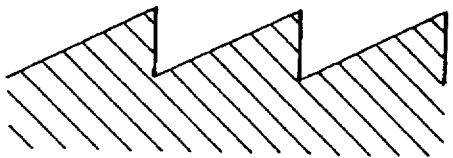

FIG_37
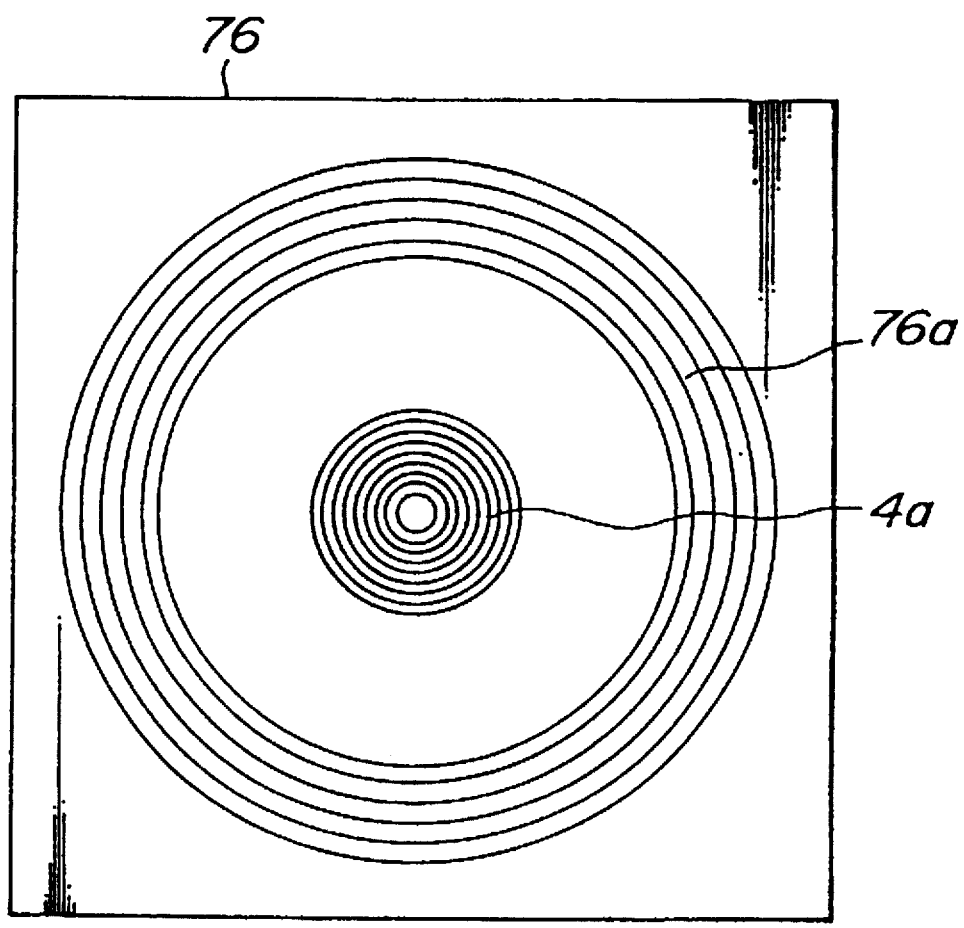

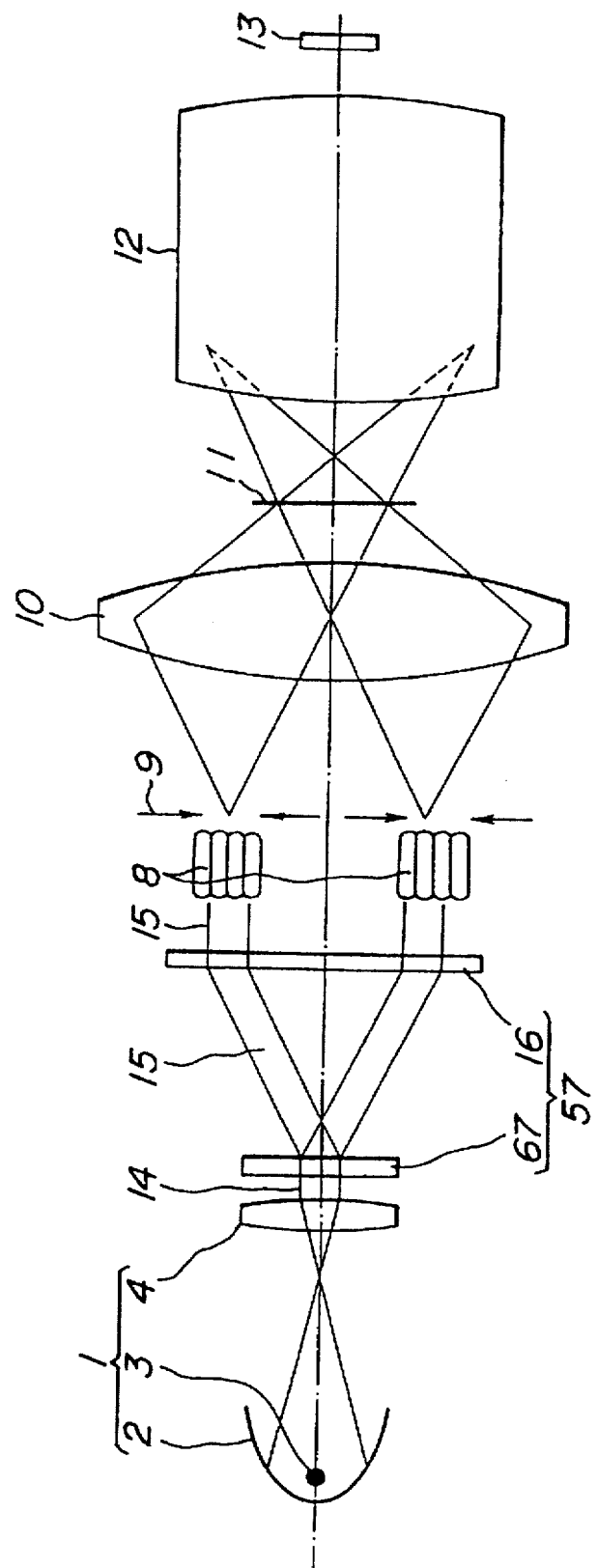
FIG._39

FIG_40c
FIG_40b  FIG_40a
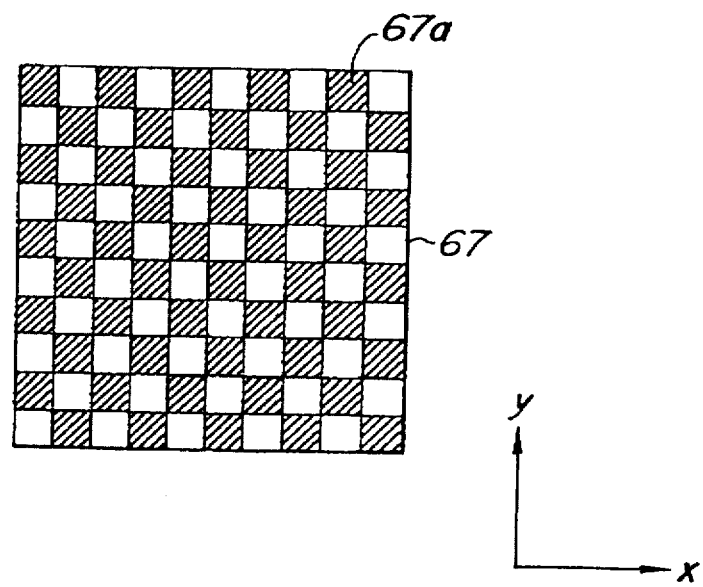

FIG_41
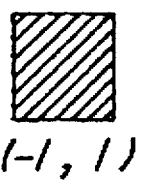
(-1, 1)
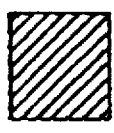
(0, 1)
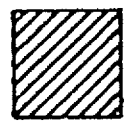
(1, 1)
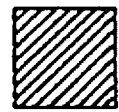
(-1, 0)
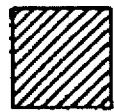
(0, 0)
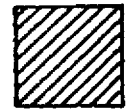
(1, 0)
67
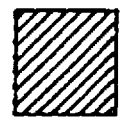
(-1, 1)
(0, -1)
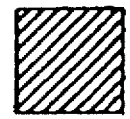
(1, -1)

ILLUMINATING OPTICAL SYSTEM FOR USE IN PROJECTING EXPOSURE DEVICE

BACKGROUND OF THE INVENTION

1. Field of the Invention

The present invention relates to an illuminating optical system for use in a projecting exposure device.

2. Related Art Statement

According to improvements of integration in recent semiconductor devices, the resolving power required in a projecting exposure device becomes higher from year to year. In order to improve the resolving power, various methods such as an effect of making the wavelength of the light source short, adoption of a phase shift method, an adoption of a versional illuminating method or the like have been studied and developed. Particularly, the versional illuminating method has an advantage that it does not require a large modification for the conventional device.

As a typical example of the versional illuminating method, there are (1) a method referred to as four pole illumination or four point illumination, by which the passing position of the light flux passing through the aperture diaphragm of the illuminating optical system is limited at four positions separated from the optical axis, and (2) a method referred to as a zonal illumination in which the passing position of the light flux passing through the aperture diaphragm of the illuminating optical system is limited in the zonal shape concentrical to optical axis. It is particularly well known that four pole illumination has remarkable effects of improving resolving power and increasing focal depth for the pattern of lines in length and width. Zonal illumination has effects of improving resolving power and increasing focal depth for the pattern of lines in length and width, which are not remarkable for four pole illumination, but have a characteristic that no dependency for the direction of the reticle is present.

A conventional example of the four pole illumination is shown, for example, in FIGS. 42 and 43. In the example shown in FIG. 42, the illuminating light flux from a light source section comprising an ellipsoidal mirror 102, a mercury lamp 103 and a lens 104 is incident on a fly-eye lens 108 and divided or separated into four by an aperture diaphragm 109a having four circular apertures, which directly follows the fly-eye lens.

In the example shown in FIG. 43, as is disclosed in Japanese Patent Application Opened No. 225,357/92, the illuminating light flux from a light source section comprising an ellipsoidal mirror 102, a mercury lamp 103 and a lens 104 is divided or separated into four by an optical fiber 121 which is branched into four.

A conventional example of the zonal illumination is shown, for example, in FIGS. 44 and 45. In the example shown in FIG. 44, the illuminating light flux from a light source section comprising an ellipsoidal mirror 102, a mercury lamp 103 and a lens 104 is incident on a fly-eye lens 108 and limited zonally by an aperture diaphragm 109b having zonal apertures, which is provided directly after the fly-eye lens.

In the example shown in FIG. 45, the illuminating light flux from a light source section comprising an ellipsoidal mirror 102, a mercury lamp 103 and a lens 104 is zonally converted by an axicon lens 122, which is provided directly after the lens 104.

In the above respective conventional examples, the four separated illuminating light flux, or the zonally converted illuminating light flux reaches a wafer 113 through a condenser lens 110, a reticle 111 and an imaging optical system 112.

In the above conventional example shown in FIG. 42, only the illuminating light flux which reaches the aperture provided to the aperture diaphragm 109a can be transmitted through the aperture, so that the utilization efficiency of the light flux of the light from the light source is decreased remarkably, thereby causing remarkable illuminance unevenness. In the above conventional example shown in FIG. 43, the utilization efficiency of the light flux of the light from the light source can be increased, but a number of optical fibers are necessary, so that the construction thereof becomes complicated and thus manufacture thereof becomes difficulty, resulting in a decrease in mechanical reliability. In the above conventional example shown in FIG. 44, only the illuminating light flux which reaches the aperture provided to the aperture diaphragm 109a can be transmitted through the aperture, so that the utilization efficiency of the light flux of the light from the light source is decreased remarkably. In the above conventional example shown in FIG. 45, the utilization efficiency of the light flux of the light from the light source can be increased, but the device becomes expensive, since it is necessary to use the axicon lens which is difficult to manufacture.

SUMMARY OF THE INVENTION

It is an object of the present invention to eliminate the above described disadvantages of the conventional illuminating optical system for use in a projecting exposure device.

It is another object of the present invention to provide an illuminating optical system for use in a projecting exposure device having a simple construction, a high utilization efficiency of light from the light source and capable of realizing easily.

According to the present invention, there is provided an illuminating optical system for use in a projection exposure device comprising a light source, a light flux separating optical system for separating a light flux from the light source, a condenser optical system for leading the light flux separated by the light flux separating optical system on a reticle, and a diffraction optical means included in the light flux separating optical system and having a linear grating pattern for separating the light flux from the light source into four.

In an embodiment of an illuminating optical system for use in a projection exposure device according to the present invention, the linear grating pattern of the diffraction optical means comprises four linear grating patterns which are so disposed that interfaces are made substantially cross form, and have diffraction pitch of substantially equal intervals, and are so constructed that grating directions of the linear grating patterns adjacent to each other are made substantially orthogonal.

In an embodiment of an illuminating optical system for use in a projection exposure device according to the present invention, the diffraction optical means comprises:

first diffraction optical surface having a linear grating pattern in the channel cross-sectional form so as to make diffraction efficiencies of $+m_1$ ordered diffraction light and $-m_1$ ordered diffraction light substantially equal, and second diffraction optical surface comprising:

first diffraction region separated from the first diffraction optical surface in the optical axis direction, and on which the +m₁ ordered diffraction light caused by the first diffraction optical surface is incident, the first diffraction region having a channel cross-sectional shape of diffraction efficiencies of +m₂ ordered diffraction light and −m₂ ordered diffraction light being substantially equal, and having a linear grating pattern in the grating direction orthogonal to that of the first diffraction optical surface; and second diffraction region on which the −m₁ ordered diffraction light caused by the first diffraction optical surface is incident, the second diffraction region having a channel cross-sectional shape of diffraction efficiencies of +m₃ ordered diffraction light and −m₃ ordered diffraction light being substantially equal, and having a linear grating pattern in the grating direction orthogonal to that of the first diffraction optical surface, wherein m₁, m₂, m₃ are optional natural number.

In an embodiment of an illuminating optical system for use in a projection exposure device according to the present invention, the diffraction optical means includes a diffraction optical element including substantially square regions having different depths displaced to each other in checkwise.

In a preferable embodiment of the illuminating optical system for use in a projection exposure device according to the present invention, there is provided an illuminating optical system for use in a projection exposure device comprising a light source, a light flux separating optical system for converting a light flux from the light source to a zonal light flux, a condenser optical system for leading the zonal light flux converted by the light flux separating optical system on a reticle, and a diffraction optical means included in the light flux separating optical system and having a concentric ring grating pattern.

In a further preferable embodiment of the illuminating optical system for use in a projection exposure device according to the present invention, the concentric ring grating pattern of the diffraction optical means has grating pitches of substantially equal intervals and channel cross-sectional shape blazed for the wavelength of the light flux of the light incident on the diffraction optical means from the light source.

In a further preferable embodiment of the illuminating optical system for use in a projection exposure device according to the present invention, the diffraction optical means comprises a diffraction optical element having grating pitches of the concentric ring grating pattern being substantially equal intervals and having a channel cross-sectional shape of diffraction efficiencies of +m₁ ordered diffraction light and −m₁ ordered diffraction light being substantially equal, wherein m₁ is an optional natural number.

In case of using the four pole illumination, the illuminating light flux is divided into four, and respective divided light fluxes are made incident on the respective reticles with slanted angle (In the conventional technique, the reflecting member(mirror), refracting member (prism) or the like are used to separate the illuminating light flux).

According to first aspect of the present invention, the light flux from the light source is separated or divided into four by the diffraction optical means having a linear grating pattern provided to the light flux separating optical system, and four separated light fluxes are lead on the reticle by the condenser optical system. In this case, the diffraction optical means is utilized to separate the illuminating light flux, so that, for example, if the primary light is used as a diffraction light, the thickness required for the diffraction surface to exhibit the diffracting operation is at most in the order of wavelength of the illuminating optical system, and thus the illuminating optical system can be downsized and decreased in weight, as compared with the conventional example in which the illuminating light flux is divided by using the reflection member and the refraction member or the like.

According to one embodiment of the first aspect of the present invention, when the light flux from the light source is incident on the linear grating pattern of the diffraction optical means provided to the light flux separating optical system, the linear grating pattern of the diffraction optical means is constructed by four linear grating patterns having diffraction pitch of substantially equal intervals, and the grating directions of the linear grating patterns adjacent to each other are made substantially orthogonal, so that the light flux from the light source is diffracted in the direction corresponding to the grating direction of the incident linear grating pattern, thereby separating four light fluxes from the light flux from the light source. Therefore, the diffraction optical means can be realized by one diffraction optical surface, so that the construction thereof can be simplified and the alignment thereof becomes easy.

According to one embodiment of the first aspect of the present invention, for example, in the case that m₁=m₂=m₃= 1, the light flux of the light incident on the first diffraction optical surface is separated into +primary diffraction light, −primary diffraction light and other ordered diffraction lights, so that the +primary diffraction light and the −primary diffraction light become substantially equal in strength. The +primary diffraction light diffracted by the first diffraction optical surface is incident on the first diffraction region of the second diffraction optical surface and then is separated into +primary diffraction light, −primary diffraction light and other ordered diffraction lights by the linear grating pattern formed on the second diffraction optical surface in the direction orthogonal to the grating direction of the first diffraction optical surface. Similarly, the −primary diffraction light diffracted by the first diffraction optical surface is incident on the second diffraction region of the second diffraction optical surface and then is separated into +primary diffraction light, −primary diffraction light and other ordered diffraction lights by the linear grating pattern formed on the second diffraction optical surface in the direction orthogonal to the grating direction of the first diffraction optical surface.

In this case, the +primary diffraction light formed by the first diffraction optical surface is diffracted on the second diffracting region to form the +primary diffraction light and the −primary diffraction light, and the −primary diffraction light formed by the first diffraction optical surface is diffracted on the second diffracting region to form the +primary diffraction light and the −primary diffraction light, so that four light fluxes thereof in total are formed, thereby serving as an illuminating light flux.

In this construction, the diameter of the light flux is not changed by the diffraction optical surface, so that if the light fluxes having same diameter are formed finally, the diameter of the light flux incident on the diffraction optical means can be decreased as compared with the previous construction for dividing the light flux in wavefront. Therefore, the diffraction optical means can be accessed to the light source, and thus whole length of the illuminating optical system can be decreased.

According to one embodiment of the first aspect of the present invention, the light flux of the light from the light source is incident on the diffraction optical element provided to the diffraction optical means of the light flux separating optical system, and the diffraction optical element is provided with substantially square regions having different depths displaced to each other in checkwise, so that considering X and Y directions shown in FIG. 40a, the incident light flux is diffracted to the diffractive order which is determined by the pitch and the depth of the diffraction grating. Considering the whole directions, the light flux incident on the diffraction optical element in which substantially square regions are disposed in checkwise, is diffracted at the positions of substantially gridwise grating points as shown in FIG. 41, so that it can select four light fluxes having high strength and disposed in the square shape from these light fluxes, and can be utilized as an illuminating light flux.

In the case of using the zonal illumination, the zonal light flux is formed from the illuminating light flux, and is incident on the reticle with an angle inclined thereto (in the conventional technique, an axicon lens or the like is used in order to form the zonal light flux).

According to the second aspect of the present invention, the light flux of the light from the light source is converted to a zonal light flux by the diffraction optical means having the concentric ring grating pattern provided to the light flux separating optical system, the converted zonal light flux is lead on the reticle by the condenser optical system. In this case, the concentric ring grating pattern can be utilized to form the zonal light flux which is easily manufactured rather than the axicon lens or the like.

According to one example of the second aspect of the present invention, when the light flux of the light from the light source is incident on the concentric ring grating pattern, the channel cross-sectional shape of the concentric ring grating pattern is blazed to the light flux, so that the loss is not caused by the concentric ring grating pattern, thereby converting the light flux of the light from the light source to the zonal light flux with high efficiency.

According to one example of the second aspect of the present invention, the light flux of the light from the light source is diffracted to the diffractive order which is determined by the grating pitch of the concentric ring grating pattern and the channel depth thereof, so that the plurality of zonal light fluxes corresponding to respective orders can be formed, thereby utilizing preferable zonal light flux of these zonal light fluxes as an illuminating light flux. In this case, for example, if $m_1=1$, the diffracting efficiencies of the $+m_1$ ordered light and the $-$ordered light are equal to each other, so that unevenless illuminating light flux can be formed. If the light fluxes having same zonal width diameter are formed finally, the diameter of the light flux can be made about one half of the light flux in the previous construction. Therefore, the diffraction optical means can be accessed to the light source, and thus whole length of the illuminating optical system can be decreased.

BRIEF DESCRIPTION OF THE DRAWINGS

FIG. 2a is a plan view showing a diffraction optical element 61;

FIG. 2b is a side view showing a portion shown by a circle A of a diffraction optical element 61;

FIG. 2c is an explanatory view showing a diffraction optical element 61;

FIG. 3 is a plan view showing a diffraction optical element 71;

FIG. 4 is a perspective view showing diffraction optical elements 61, 71 and a near portion thereof;

FIG. 5 is an explanatory showing a method of forming the diffraction optical elements 61, 71;

FIG. 6a and 6b are explanatory views showing another construction of the diffraction optical elements 61, 71;

FIG. 7a and 7b are explanatory views showing another construction of the diffraction optical elements 61, 71;

FIG. 8 is an explanatory view showing another construction of the diffraction optical elements 61, 71;

FIG. 10a is a plan view showing a diffraction optical element 62;

FIG. 10b is a side view showing a diffraction optical element 62;

FIG. 10c is an explanatory view showing a portion shown by a circle A of a diffraction optical element 62;

FIG. 11 is a plan view showing a diffraction optical element 72;

FIG. 12 is a perspective view showing diffraction optical elements 62, 72 and a near portion thereof;

FIG. 13 is an explanatory view showing another construction of the diffraction optical elements 72;

FIG. 14 is an explanatory view showing a projection exposure device corresponding to FIG. 13;

FIG. 16a and 16b are a plan view and a side view showing a diffraction optical element 63;

FIG. 17a and 17b are a plan view and a side view showing a diffraction optical element 73;

FIG. 19 is a perspective view showing diffraction optical elements 63, 73 and a near portion thereof;

FIG. 20 is an explanatory view showing another construction of the diffraction optical elements 63, 73;

FIG. 22a and 22b are a plan view and a side view showing a diffraction optical element 64;

FIG. 23a and 23b are a plan view and a side view showing a diffraction optical element 74;

FIG. 27a and 27b are a plan view and a side view showing a diffraction optical element 65;

FIG. 28a and 28b are a plan view and a side view showing a diffraction optical element 75;

FIG. 29 is a perspective view showing diffraction optical elements 65, 75 and a near portion thereof;

FIG. 31a and 31b are a plan view and a side view showing a diffraction optical element 66;

FIG. 32a and 32b are a plan view and a side view showing a diffraction optical element 76;

FIG. 33 is a perspective view showing diffraction optical elements 66, 76 and a near portion thereof;

FIG. 35a and 35b are a plan view and a side view showing a diffraction optical element 166;

FIG. 36a and 36b are a plan view and a side view showing a diffraction optical element 176;

FIG. 37 is an explanatory view showing another construction of the diffraction optical elements 76;

FIG. 39 is an explanatory view showing seventh embodiment of an illuminating optical system for a projection exposure device according to the present invention;

FIG. 40a, 40b and 40c are a plan view and a side views showing a diffraction optical element 67;

FIG. 41 is an explanatory view showing a diffraction pattern generated by a diffraction optical element 67;

DETAILED EXPLANATION OF THE PREFERRED EMBODIMENT

Figure 1:
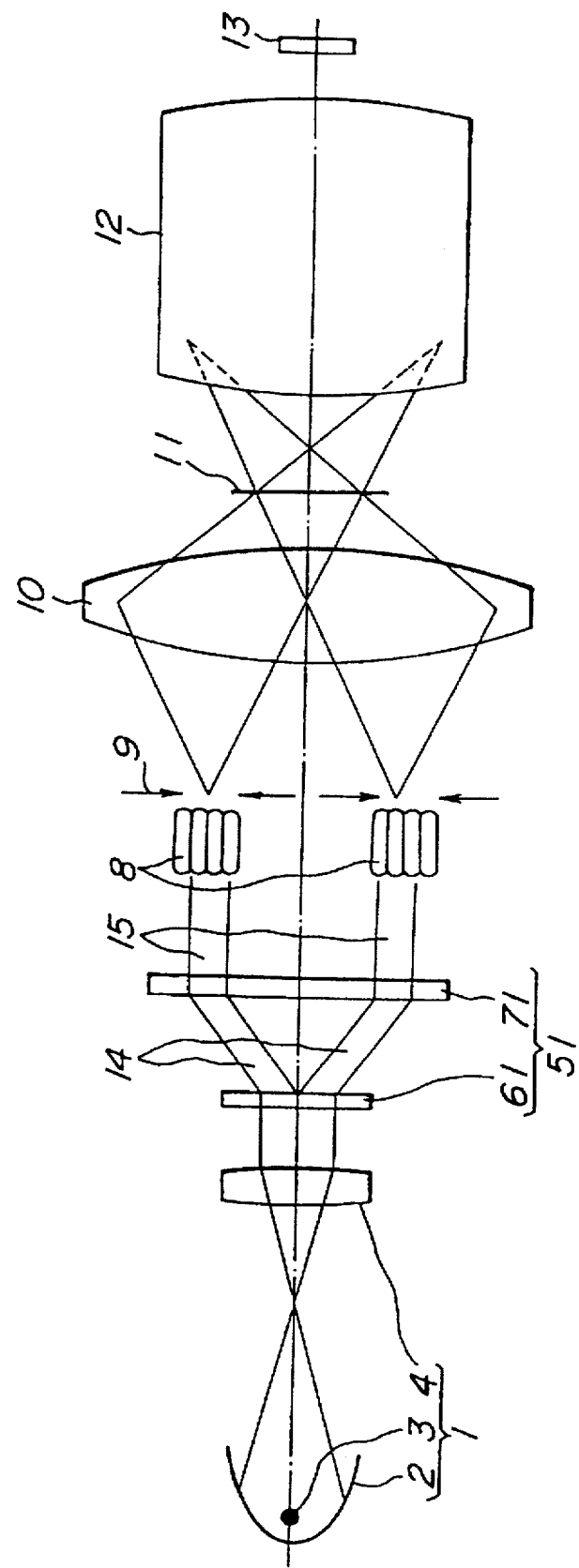
FIG. 1 is an explanatory view showing first embodiment of an illuminating optical system for a projection exposure device according to the present invention.

The drawings show various embodiments of an illuminating optical system for a projection exposure device according to the present invention. Like parts are shown by corresponding reference characters throughout several views of the drawings.

FIG. 1 shows a first embodiment of an illuminating optical system for a projection exposure device according to the present invention. In FIG. 1, reference numeral 1 is a light source portion comprising an ellipsoidal mirror 2, a mercury lamp 3 and a lens 4. Reference numeral 51 is a light flux separating portion comprising diffraction optical elements 61 and 71 of a transmission type.

The diffraction optical element 61 consists of, for example, a quartz, and as shown in FIG. 2a (plan view), 2b (side view) and 2c (extensional view shown at a portion of FIG. 2b), four regions disposed at its one surface and having substantially cross shaped interface are provided with linear diffraction gratings 61a having equal interval, and the directions of grating patterns of respective regions are crossed at right angles between adjacent regions. Cross-shape of the linear diffraction grating 61a is blazed for primary diffraction light. The diffraction optical element 71 consists of, for example, a quartz, and as shown in FIG. 3, four separated regions corresponding to four regions of the linear diffraction grating 61a are provided with linear diffraction gratings 71a having equal interval, respectively. Cross-shape of the linear diffraction grating 71a is blazed for primary diffraction light, but its blazed direction becomes opposite to that of the linear diffraction grating 61a. Another surface, on which the linear diffraction grating is not provided, of the diffraction optical elements 61 and 71 is coated with an anti-reflection film (not shown) for light from the light source, respectively.

In FIG. 1, reference numeral 8 are refers to fly-eye lenses disposed at four ports which are eccentrically positioned from a light axes according to light fluxes separated at a light separating section 51. Four aperture diaphragm 9 having four circular apertures is disposed directly behind the fly-eye lens 8. In FIG. 1, reference numeral 10 is a condenser lens, and reference numeral 11 is a reticle. An imaging projection system 12 is displaced between the reticle 11 and a wafer 13.

If the illuminating optical system is actually constructed by using the first embodiment of the present invention, a further optical element not shown (wavelength selecting filter etc.) is required, these elements are the same as conventional ones, so that explanation thereof is omitted.

Then, a flow of illuminating light flux of the first embodiment is explained with respect to FIG. 4.

Substantially parallel light flux formed by the light source portion 1 is incident on the diffraction optical element 61 (in this case, when the shape of diffraction grating region of the diffraction optical element 61 is made square as shown in FIG. 4, the diaphragm (not shown) corresponding to the shape of the diffraction grating region may be disposed on the side of the light source portion rather than on the diffraction optical element 61). As shown in FIG. 4, which is a perspective view showing diffraction optical elements 61, 71 and a near portion thereof, the illuminating light flux 14 is separated into four illuminating light fluxes 15 by the diffraction optical element 61 (wavefront splitting). The reason for performing such a wavefront splitting is that the linear diffraction grating 61a is formed to the diffraction optical element 61 in such a manner that the grating direction or the blazing direction are different from each other, and the light fluxes are diffracted at the desired angle every incident region.

The illuminating light fluxes 15 are collimated substantially parallel to the optical axes by the diffraction optical element 71, respectively, and then are incident on the fly-eye lens 8. In this case, the cross-sectional shape of the linear diffraction gratings 61a, 71a are blazed, so that a diffraction efficiency of substantially 100% is obtained, resulting in an improvement of utilization efficiency of the light from the light source.

The end surface of the output side of the fly-eye lens 8 has a function of secondary light source, so that an aperture diaphragm 9 having four circular apertures is employed. The shape of the four apertures may be square so as to coincide with the shape of the separated light flux, but alternatively they may be circular. In the case of circular apertures, a part of the light flux may be screened, but as compared with the case that such an aperture is only provided without using the technique according to the present invention, the utilization efficiency of the light from the light source becomes very high. The illuminating light flux passing through the four apertures of the aperture diaphragm 9 four-polar illuminates the reticle 11 through the condenser lens 10, so that the image of the reticle 11 is imaged on the wafer 13 by the imaging optical system 12.

Then, providing that $\theta_1$ is an incident angle, $\theta_2$ is the output angle, m is diffraction order, and $\lambda$ is wavelength of light, a grating pitch p of the linear diffraction grating 61a, 71a satisfies and determines the following relation.

$$p(\sin\theta_1 - \sin\theta_2) = m\lambda$$

In this case, in the case that the linear diffraction gratings 61a and 71a adopt different order, the grating pitches of the linear diffraction gratings 61a and 71a are not necessary to be the same. Moreover, the grating pitches are not necessary to be equal interval. Generally, the grating pitch takes out only the four separated and collimated light fluxes by a combination of the diffraction optical elements 61 and 71, so that a proper pitch distribution may be given to the diffraction optical elements 61 and 71, but indeed, the diffraction optical elements 61 and 71 may be made equal interval in order to facilitate manufacture.

As a manufacturing method of the diffraction optical elements 61 and 71, it can be used the well known method, for example, the method that the blazing is performed by the inclined ion beam illumination, the four same matters are formed as elements corresponding to four regions, respectively, and are combined.

While as the method of manufacturing the diffraction optical element as only one element, as shown in FIG. 5, the grating pattern shown in FIG. 2a is divided into four grating patterns 61b, and then the diffraction optical element is formed in four times by the inclined ion beam illumination, or the method that as explained in Japanese Patent Application Opened No. 1109/90, n numbered masks (n is natural number) corresponding to the grating pattern of FIG. 2a is prepared, and n times of etching steps are repeated, resulting in a manufacture of a diffraction optical element having the blazed shape closed to step shape of $2^n$ steps, can also be adopted. In this case, if the blazed shape is made close to the step shape, the problem whether or not the diffraction efficiency becomes low arises, but for example, when n=4, the stepped shape becomes 16 steps, so that the diffraction efficiency of 99% is obtained, and thus there is no problem, in practice.

As described above, this first embodiment utilizes the blazed diffraction optical element as a light flux separating optical system, so that the illuminating light generated from the light source can be utilized with excellent efficiency, and thus the through-put can be improved.

In the above description, the present invention explained the constructions shown in FIGS. 2a–2c and 3 as a disposing example of the linear diffraction gratings 61a, 71a on the diffraction optical elements 61, 71. The present invention is not limited to these constructions and various changes and modifications can be added thereto. For example, as shown in FIG. 6a, the linear diffraction gratings 61c divided into four and substantially square are so displaced on the diffraction optical element 61 that its grating directions become substantially vertical or parallel to the interface thereof, and thus as shown in FIG. 6b, the linear diffraction gratings 71c are displaced on the diffraction optical element 71 in correspondence thereto, or as shown in FIG. 7a, the linear diffraction gratings 61d divided into four and substantially an equilateral triangle are so displaced on the diffraction optical element 61 that its grating directions become substantially 45° to the interface thereof, and thus as shown in FIG. 7b, the linear diffraction gratings 71d are displaced on the diffraction optical element 71 in correspondence thereto. As shown in FIG. 8, also, the diffraction optical elements 61, 71 are uniformed therewith and diffraction surfaces are provided on two opposite surfaces, respectively, and the linear diffraction gratings 61a, 71a shown in FIG. 4 are formed on the respective diffraction surfaces, thereby obtaining the same effect as in the first embodiment. Moreover, in the above embodiment, the diffraction order of the linear diffraction gratings 61a, 71a is made primary, but another diffraction order may be used. In the above embodiment, a mercury lamp 3 is used as a light source, but other light source, for example, excimer (excited dimer) laser can be used. Moreover, it is as a matter that as a materials of the diffraction optical elements 61, 71, an optical material having excellent transmittivity rather than the quartz instead thereof can be used.

Figure 9:
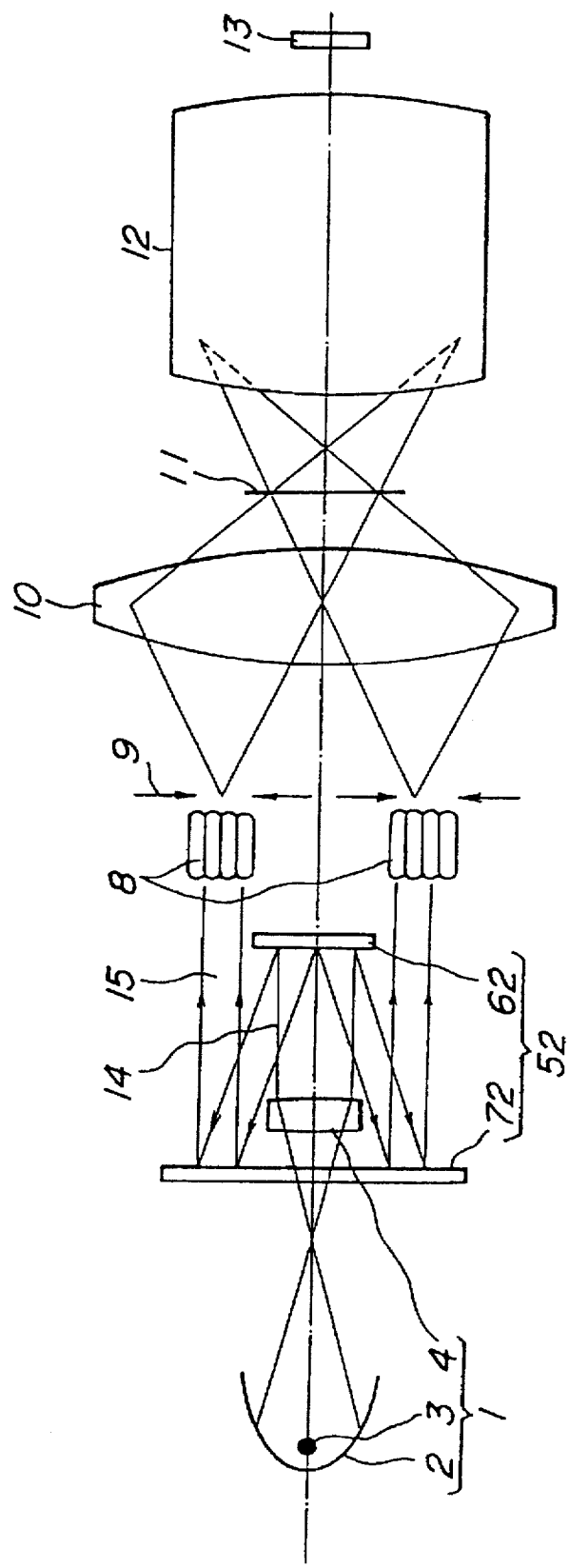
FIG. 9 is an explanatory view showing second embodiment of an illuminating optical system for a projection exposure device according to the present invention.

FIG. 9 shows second embodiment of an illuminating optical system for a projection exposure device according to the present invention. Like parts are shown by corresponding reference characters shown in the first embodiment, and its detailed explanation is omitted. In FIG. 9, reference numeral 52 is a light flux separating portion consisting of diffraction optical elements 62 and 72. In the first embodiment, the diffraction optical element 61 having small area is displaced on the side of the light source portion 1, and the diffraction optical element 71 having large area is displaced on the side of the fly-eye lens 8, but in the second embodiment, the diffraction optical element 71 having large area is displaced on the side of the light source portion 1, and the lens 4 is displaced between the diffraction optical elements 72 and 62.

As shown in FIG. 10a (plan view), 10b (side view) and 10c (detailed view shown by a circle B shown in FIG. 10b), the diffraction optical element 62 is provided with at its four regions on which substantially crossed interfaces are displaced on one surface thereof, linear diffraction gratings 62a of reflection type, the direction of the grating patterns of respective regions are disposed orthogonally with each other between adjacent regions. The cross-sectional shape of the linear diffraction grating 62a is blazed for special reflecting diffraction order, for example, +primary. On the while, as shown in FIG. 11, the diffraction optical element 72 is so provided that linear diffraction gratings 72a of reflection type are formed at four separated regions corresponding to four regions of the linear diffraction grating 62a on one surface of the diffraction optical element 72, and the cross-sectional shape of the linear diffraction grating 72a is blazed for special reflecting diffraction order, for example, –primary. Moreover, The region 72b near center of the diffraction optical element 72 is punched out widely than the passing range of the illuminating light flux at the position of the diffraction optical element 72.

The flow of the illuminating light flux in the second embodiment is then explained with respect to FIG. 12.

Substantially parallel light flux 14 formed by the light source portion 1 is incident on the diffraction optical element 62 as shown in FIG. 12 being the perspective view near the diffraction optical elements 72, 62. While the light flux generated from the mercury lamp 3 is extended through the region 72b of the diffraction optical element 72, and then the illuminating light flux 14 is reflected and diffracted in the various directions, respectively, every incident regions by the the linear diffraction grating 62a of the diffraction optical element 62, and is divided into four light fluxes 15. Then, the light fluxes 15 are collimated in the direction parallel to the optical axis by the linear diffraction grating 72a of the diffraction optical element 72, thereby forming four separated light flux. These four separated light fluxes are incident on the fly-eye lens 8. For convenience of explanatory, parts of the light fluxes 14, 15 are omitted.

The linear diffraction grating 62a is formed on a quartz substrate by using, for example, the method described in the first embodiment, a metal, for example, aluminum is vaporized thereon in order to improve the reflectivity. Alternately, a metal may be deposited on a substantially parallel plain board, and this metal is worked directly with a ruling engine, thereby forming a linear diffraction grating. As a material of the diffraction optical elements 62, 72, a metal is also used, in this case, the linear diffraction grating may be formed by only the ruling engine.

In the second embodiment, two reflection diffraction gratings are used as a light flux separating optical system to reflect the optical path, so that the length of optical axis direction of the projection exposure device can be decreased.

In the second embodiment, as shown in FIG. 13, a diffraction grating 4a of transmitting type having the same function as the lens 4 is provided at the center portion of the diffraction optical element 72 instead of the lens 4, thereby giving the function of the lens 4 to the diffraction optical element 72, resulting in a uniform of the lens 4 to the diffraction optical element 72. In this case, the illuminating optical system is formed as shown in FIG. 14, so that the number of components can be reduced and the alignment of the components becomes easy. Moreover, in the case of the construction shown in FIG. 14, as a material of the diffraction optical element 72, an optical material such as a quartz is desirable to form a diffraction grating 4a of transmitting type. Moreover, in the same manner as in the first embodiment, a light source rather than the mercury lamp 3, such as excimer laser can be used, or the aperture diaphragm 9 having four circular apertures can be displaced at the position to be displaced by the aperture diaphragm (directly after the fly-eye lens 8).

Figure 15:
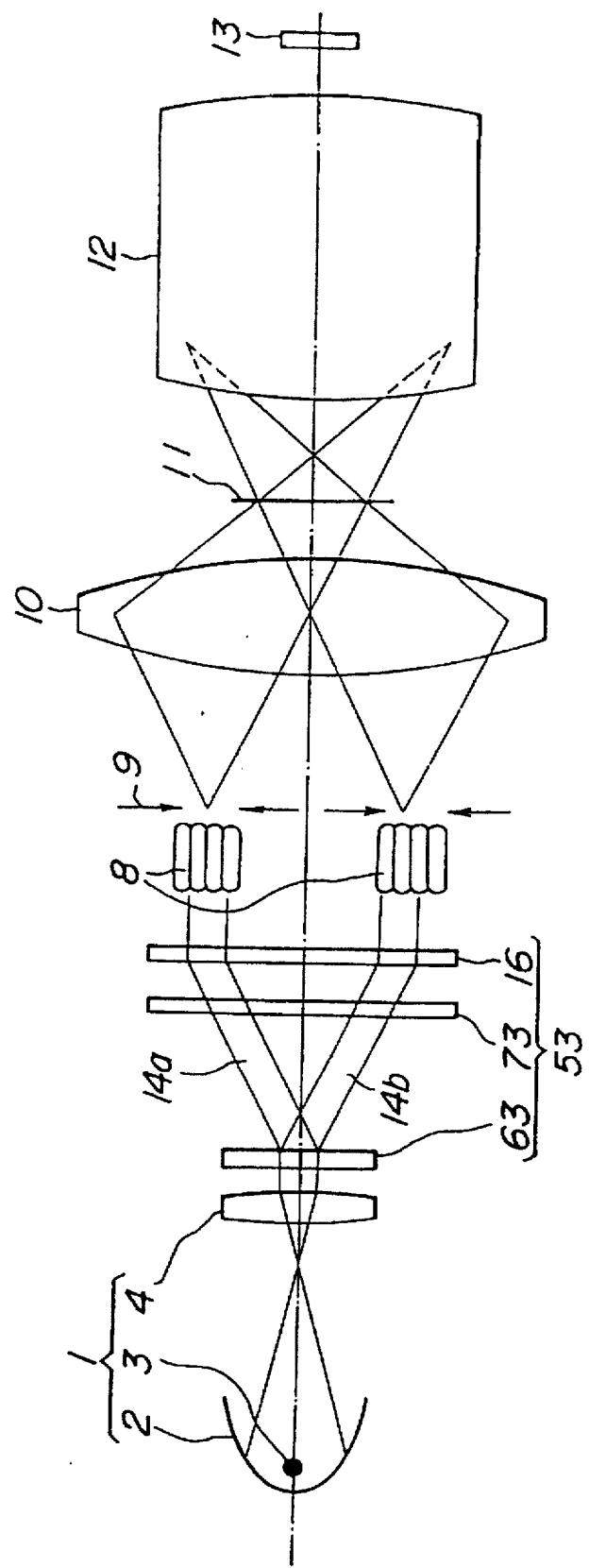
FIG. 15 is an explanatory view showing third embodiment of an illuminating optical system for a projection exposure device according to the present invention.

FIG. 15 shows third embodiment of an illuminating optical system for a projection exposure device according to the present invention. Like parts are shown by corresponding reference characters shown in the first embodiment, and its detailed explanation is omitted. In FIG. 15, reference numeral 53 is a light flux separating portion consisting of diffraction optical elements 63 and 73 and a light flux deflecting member 16. As shown in FIG. 16a (plan view) and 16b (side view), the diffraction optical element 63 is made of, for example, quartz and is provided with at its one surface linear diffraction gratings 63a having equal intervals. The cross-sectional shape of the linear diffraction grating 63a is a rectangular shape having a duty ratio of 1:1, and its depth $t_1$ is so optimized that a sum value of diffraction efficiency of +primary diffraction light and −primary diffraction light becomes maximum. In this case, the depth $t_1$ is as follows.

$$t_1 = \lambda/\{2(n_1-1)\}$$

The sum value of diffraction efficiency of +primary diffraction light and −primary diffraction light is about 81%, wherein $\lambda$ is a wavelength of the light from the light source, $n_1$ is refraction index of the substrate of the diffraction optical element 63.

While as shown in FIG. 17a (plan view) and 17b (side view), the diffraction optical element 73 is made of, for example, quartz and one surface of the diffraction optical element 73 is provided at two separated regions corresponding to light fluxes separated by the linear diffraction grating 63a with linear diffraction gratings 73a, 73b, respectively, and the directions of the grating pattern of the linear diffraction gratings 73a, 73b are orthogonal to the directions of grating pattern of the linear diffraction grating 63a, viewed from the direction of optical axis. In this case, the cross-sectional shape of respective channels of the linear diffraction gratings 73a, 73b have a rectangular shape having a duty ratio of 1:1 as in the linear diffraction grating 63a, and its depth $t_2$ is so optimized that diffraction efficiencies of +primary diffraction light and −primary diffraction light are equal to each other and become maximum. When the mercury lamp 3 is used as a light source, the cross-sectional shape of the light flux generated from the light source portion 1 becomes circular, so that the linear diffraction gratings 63a, 73a, 73b may be formed on a square region in which the length of one arm is larger than the diameter of the light flux. Moreover, it is as a matter that a circular region may be used instead of square region, but the square region may generally be used in order to manufacture it easily.

The light flux deflection member 16 is made of, for example, quartz, and one surface thereof is provided, at its four regions having equal intervals separated to each other corresponding to +primary light, −primary light from respective linear diffraction gratings 73a, 73b of the diffraction optical element 73, with a linear diffraction grating 16a having equal intervals. The cross-sectional shape of the linear diffraction grating 16a is blazed for special diffraction order light, for example, the primary light.

The flow of the illuminating light flux in the third embodiment is then explained with respect to FIG. 19.

As shown in FIG. 19 being a perspective view near the linear diffraction gratings 63, 73, the light flux incident on the diffraction optical element 63 is diffracted by the linear diffraction grating 63a as a diffraction light of +primary light 14a, −primary light 14b and other orders. In this case, as described above, the depth $t_1$ of the linear diffraction grating 63a is optimized for the +primary light, −primary light, so that about 40.5% of the incident light flux is separated as +primary light, about 40.5% of the incident light flux is separated as −primary light, and the remainder (about 19%) is separated as other ordered light. The +primary light 14a, and the −primary light 14b are incident on the linear diffraction gratings 73a, 73b of the diffraction optical element 73, respectively.

The light flux incident on the linear diffraction gratings 73a is diffracted as the diffraction light of +primary light 15a, −primary light 15b and other orders, and the light flux incident on the linear diffraction gratings 73b is diffracted as the diffraction light of +primary light 15c, −primary light 15d and other orders. These light fluxes 15a, 15b, 15c and 15d are incident on the light flux deflecting member 16, thereby collimating substantially parallel light flux by a linear diffraction grating 16a, and then incident on the fly-eye lens 8.

In this third embodiment, the diffraction optical element of the rectangular shape having a duty ratio of 1:1 is used as a light flux separating optical system, so that it is not necessary to blaze the cross-sectional shape of the linear diffraction grating, and thus its manufacture becomes easy. Therefore, as a manufacturing method of the diffraction optical elements 63, 73, the conventional method, for example, a method of manufacturing the above rectangular shape by for example the photolithography technique and the dry etching technique can be used. Even though a loss of light is caused by the light flux other than +primary light, −primary light diffracted with the diffraction optical elements 63, 73, the loss of light by the respective diffraction gratings is about 19%, so that generally viewing, the utilization efficiency of about 65% can be obtained for the light flux incident on the diffraction optical element 63. This utilization efficiency is very high as compared with the case of providing the diaphragm having four apertures as an aperture diaphragm without using the technique according to the present invention. Moreover, since the diameter of the light flux is not changed with the diffraction optical element 63, if four light fluxes having the same diameter are formed, the diameter of the light flux 14 can be made ½, and thus the lens 4 can be made near the light source, as compared with the first embodiment in which the illuminating light flux is divided into four at wavefront, thereby making short whole length of the illuminating optical system.

Figure 18:
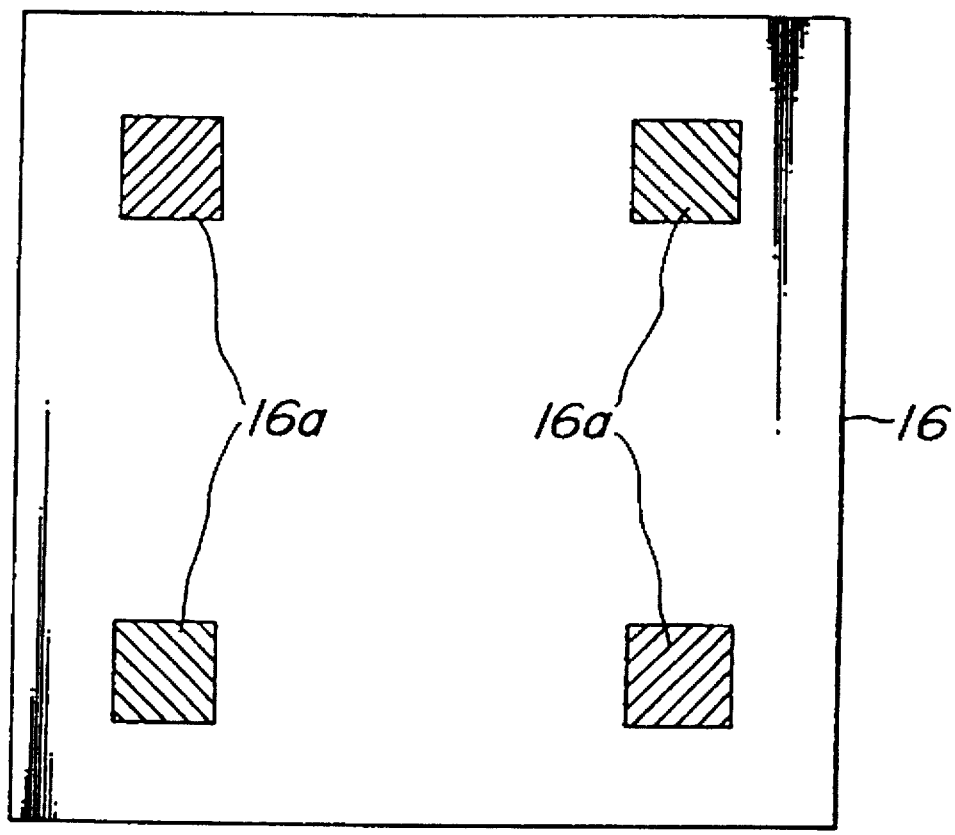
FIG. 18 is a plan view showing a light flux deflection element 16.

In this third embodiment, the blazed diffraction optical element is used as a light deflection member, other members such as four triangle prisms and mirrors or the like can be used instead thereof, to obtain the same effects. However, if the diffraction optical element shown in FIG. 18 is used, the light flux deflecting member can be uniformly formed, so that the alignment becomes easy and the device can be manufactured inexpensively. The channel cross-sectional shape of the diffraction grating for making the diffraction efficiency of +primary diffraction light, −primary diffraction light equal is not restricted to the rectangular shape of the above described duty ratio of 1:1, and is made a trapezoidal shape of bilateral symmetry or a sinusoidal wave shape. The case that the sum of diffraction efficiencies of +primary diffraction light, −primary diffraction light becomes maximum is the example of the trapezoidal shape in the third embodiment.

As shown in FIG. 20, the diffraction optical elements 63, 73 can be made unity as a diffraction optical element. In this case, one surface of the diffraction optical element is provided with the linear diffraction grating 63a, and the other surface thereof is provided the linear diffraction grating 73c, the cross-sectional shape of the linear diffraction grating 63a, 73c is made a rectangular shape of duty ratio 1:1, and its depth is optimized in such a manner that the sum of diffraction efficiencies of +primary diffraction light, −primary diffraction light becomes maximum. In this case, the light flux separation can be performed by one diffraction optical element, so that the construction becomes simple and the alignment becomes easy.

Figure 21:
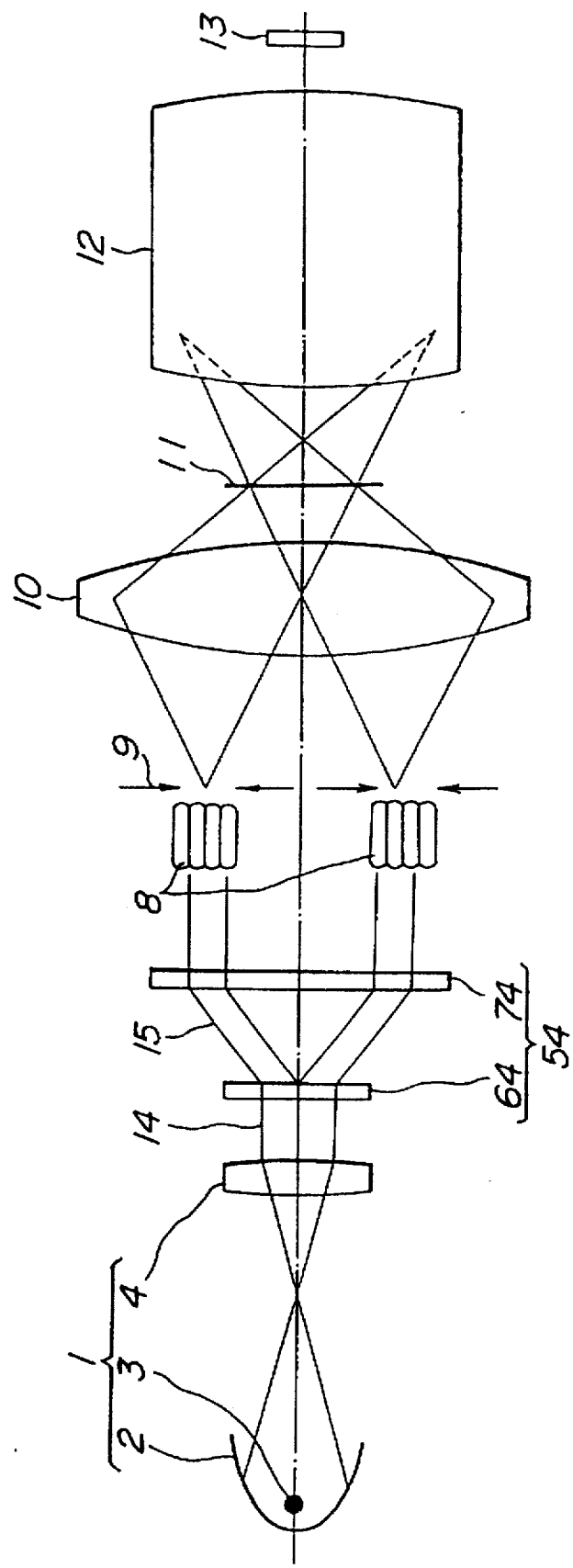
FIG. 21 is an explanatory view showing fourth embodiment of an illuminating optical system for a projection exposure device according to the present invention.

FIG. 21 shows fourth embodiment of an illuminating optical system for a projection exposure device according to the present invention. Like parts are shown by corresponding reference characters shown in the first embodiment, and its detailed explanation is omitted. In FIG. 21, reference numeral 54 is a light flux separating portion consisting of diffraction optical elements 64 and 74 of transmitting type. As shown in FIG. 22a (plan view) and 22b (side view), the diffraction optical element 64 is made of, for example, quartz and is provided at its one surface with a concentric ring pattern diffraction grating 64a having equal interval and equal pitch. The cross-sectional shape of the linear diffraction grating 64a is blazed for primary light. While as shown in FIG. 23a (plan view) and 23b (side view), one surface of the diffraction optical element 74 is provided at zonal region corresponding to light fluxes from the diffraction grating 64a with a concentric ring pattern diffraction grating 74a having equal interval and equal pitch. The cross-sectional shape of the linear diffraction grating 74a is blazed for primary light. In this case, the direction of the blazing is opposite to that of the diffraction grating 64a.

Figure 24:
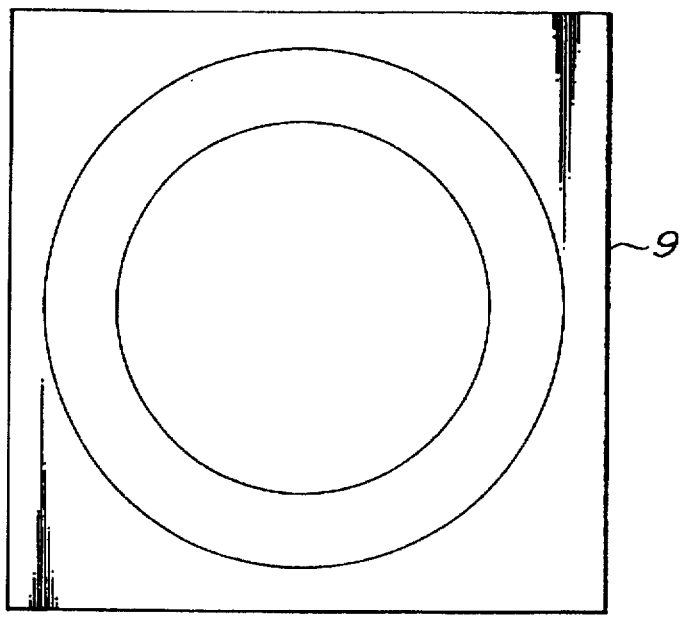
FIG. 24 is a plan view showing an aperture diaphragm 9.

The fly-eye lens 8 is disposed zonally so as to correspond to the light flux formed by the light flux separating portion 54. As shown in FIG. 24, the aperture diaphragm 9 is provided with a zonal aperture corresponding to the fly-eye lens 8.

The method of manufacturing the blazed concentric ring pattern diffraction grating, such as the diffraction optical elements 64, 74 may use the conventional method, for example, the methods disclosed in Japanese Patent Application Opened Nos. 21,171/88 and 1,109/90.

Figure 25:
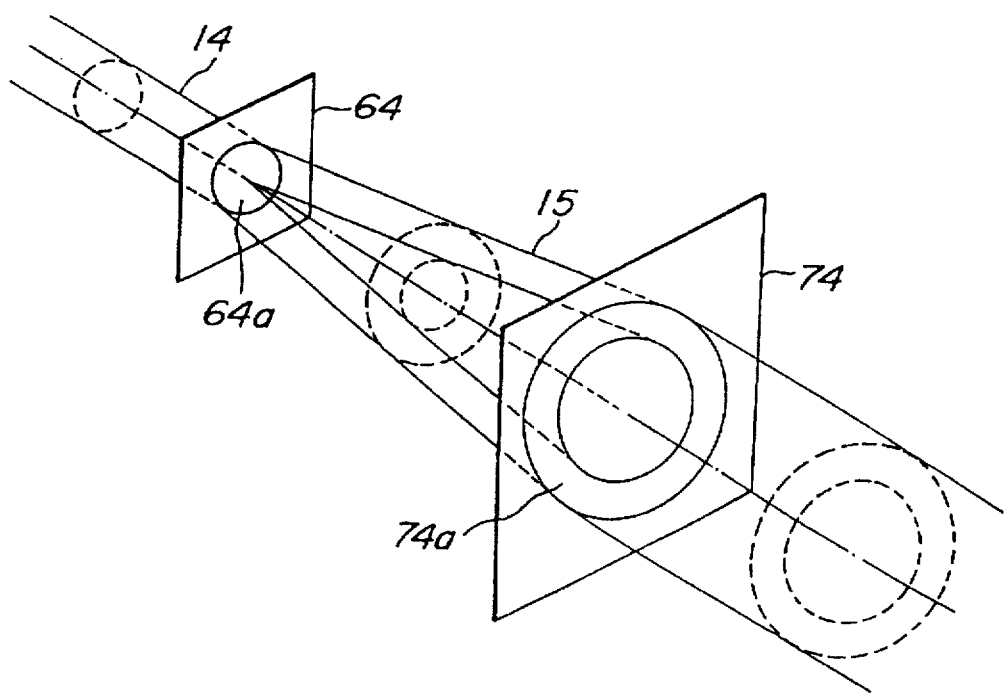
FIG. 25 is a perspective view showing diffraction optical elements 64, 74 and a near portion thereof.

The flow of the illuminating light flux in the fourth embodiment is then explained with respect to FIG. 25.

A substantially parallel light flux 14 formed by the light source portion 1 is incident on the diffraction optical element 64. As shown in FIG. 25 being the perspective view near the diffraction optical elements 64, 74, the light flux 14 incident on the diffraction optical element 64 is converted to the zonal illuminating light flux 15 by the diffraction grating 64a of the diffraction optical element 64, and the zonal illuminating light flux 15 is converted and collimated in the direction parallel to the optical axis by the diffraction optical element 74 and is incident on the fly-eye lens 8. In this case, the end surface at the exit side of the fly-eye lens 8 serves as a secondary light source, so that the light flux passing through a zonal aperture of the aperture diaphragm 9 disposed directly after the end surface zonally illuminates the reticle 11 through the condenser lens 10.

In this fourth embodiment, the blazed diffraction optical element is used as a light flux separating optical system, so that the illuminating light generated from the light source can be utilized efficiently, and thus, the throughput can be improved. The diffraction optical element in the light flux separating section is manufactured easily and two flat plates are displaced as a diffraction optical element, so that as compared with conventional device, the construction becomes simple and the alignment is easy.

Figure 26:
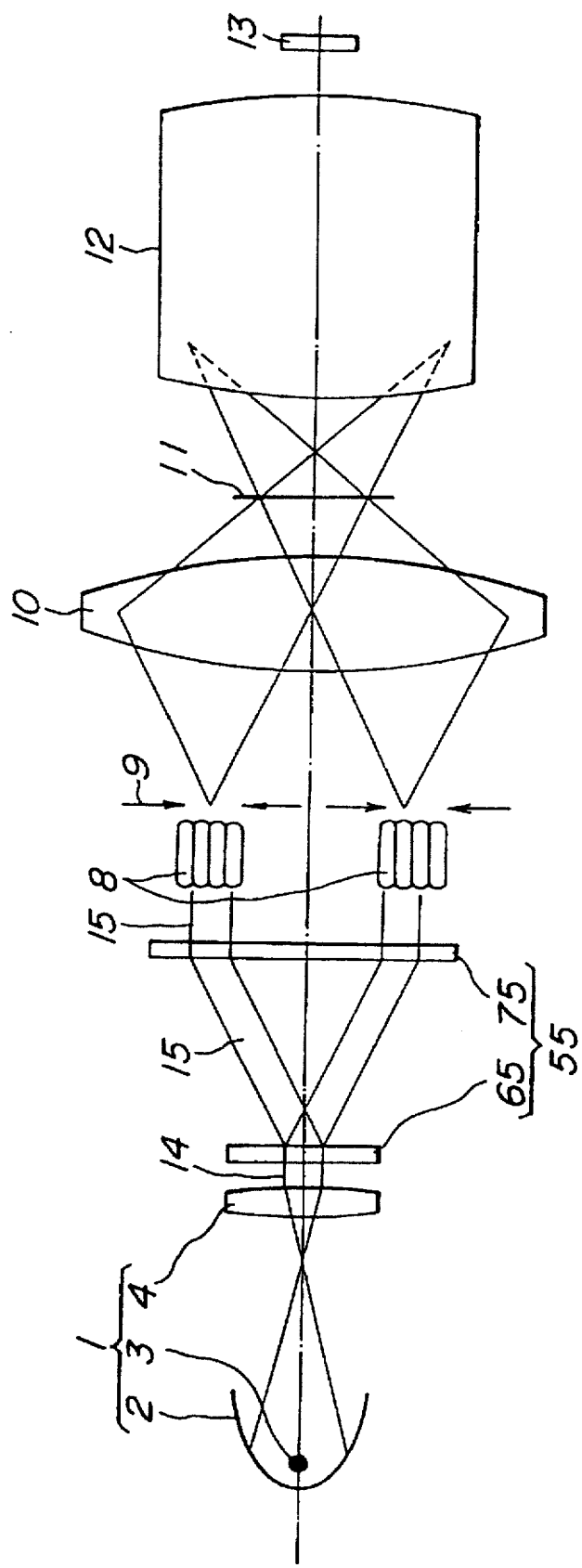
FIG. 26 is an explanatory view showing fifth embodiment of an illuminating optical system for a projection exposure device according to the present invention.

FIG. 26 shows fifth embodiment of an illuminating optical system for a projection exposure device according to the present invention. Like parts are shown by corresponding reference characters shown in the first embodiment, and its detailed explanation is omitted. In FIG. 26, reference numeral 55 is a light flux separating portion consisting of diffraction optical elements 65 and 75 of transmitting type. As shown in FIG. 27a (plan view) and 27b (side view), one surface of the diffraction optical element 65 is provided with a concentric ring pattern diffraction grating 65a having equal interval and equal pitch. The cross-sectional shape of the linear diffraction grating 16a is a rectangular shape having a duty ratio of 1:1, and its depth $t_3$ is so optimized that the diffraction efficiencies of +primary diffraction light and −primary diffraction light become equal and maximum. In this case, the depth $t_3$ is the same as in the third embodiment and as follows.

$$t_3 = \lambda / \{2(n-1)\}$$

As shown in FIGS. 28a (plan view) and 28b (side view), the zonal region corresponding to the light flux from the diffraction grating 65a is provided with a concentric ring pattern diffraction grating 75a having equal interval and equal pitch. The cross-sectional shape of the diffraction grating 75a is blazed for particular diffraction ordered light, for example, primary light.

The flow of the illuminating light flux in the fifth embodiment is then explained with respect to FIG. 29.

For simplicity of the explanation, the operation is considered within a plain including an optical axis, the light flux 14 from the light source 1 is incident on the diffraction optical element 65. In this case, the diffraction grating 65a of the diffraction optical element 65 becomes the concentric pattern, and is equivalent to the linear diffraction grating at a micro region in the angle direction. Therefore, the light flux incident on the the diffraction optical element 65 is diffracted to +primary light, −primary light, and other ordered light. As described above, the depth $t_3$ of the diffraction grating 65a is optimized for the +primary light and −primary light, so that about 40.5% of the incident light flux is separated as +primary light, about 40.5% of the incident light flux is separated as −primary light, and the remainder (about 19%) is separated as other ordered light. The +primary light, and the −primary light are incident on the linear diffraction grating 75a of the diffraction optical element 75, and are converted and directed to the direction substantially parallel to the optical axis.

Then, the operation is considered macroscopically. As described above, considered the microscopic region in the angle direction, as shown in FIG. 29 being the perspective view near the diffraction optical elements 65, 75, the light flux incident on the diffraction grating 65a is separated as the +primary light and −primary light. If this idea is applied to whole periphery of the diffraction grating 65a, it is found that the light flux 14 incident on the diffraction optical element 65 is converted into the zonal light flux 15 by the diffraction grating 65a. Thus converted light flux 15 is incident on the diffraction optical element 75, and is converted to its running direction by the diffraction grating 75a as the zonal light flux. The flow of the light flux thereafter is the same as that of the fourth embodiment, so that its detailed explanation is omitted.

This fifth embodiment uses the diffraction optical element having rectangular shape of duty ratio 1:1, so that its manufacture becomes easy. Moreover, if the light flux having the same zonal width is formed finally, the light flux having its diameter of one half of that used in the fourth embodiment may be utilized, so that the lens 4 can be accessed to the light source, resulting in a decrease of whole length of the illuminating optical system.

Figure 30:
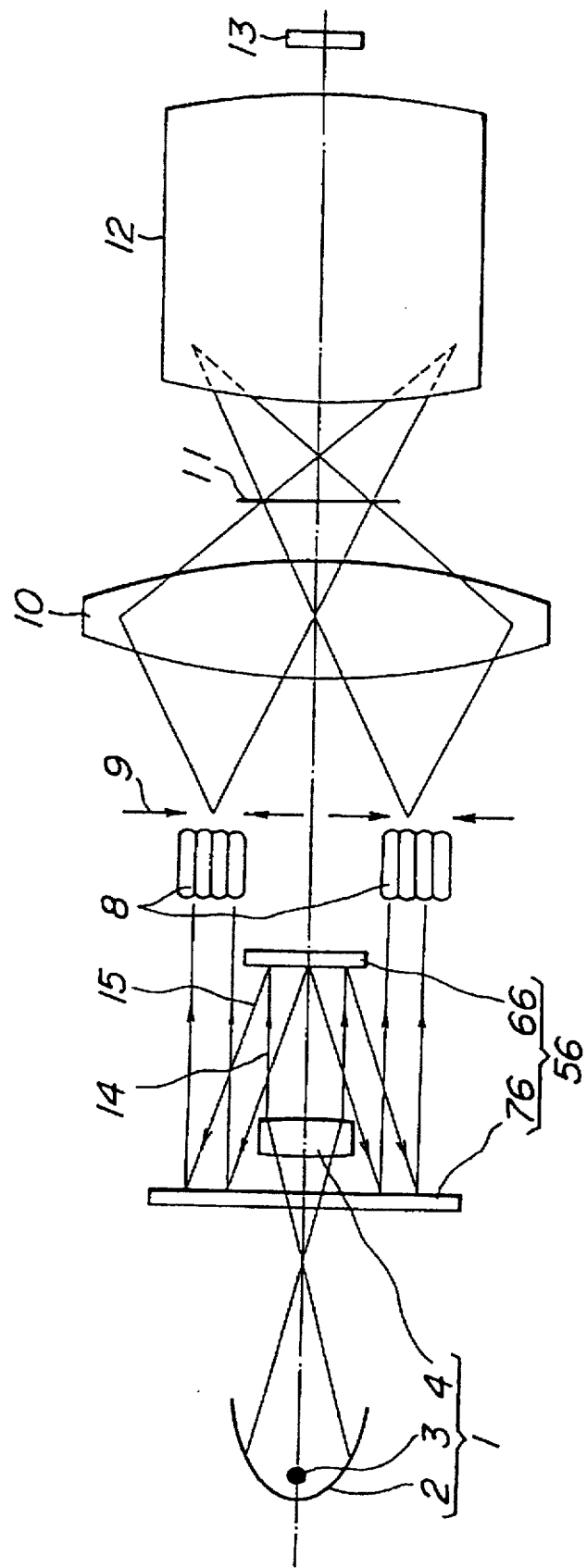
FIG. 30 is an explanatory view showing sixth embodiment of an illuminating optical system for a projection exposure device according to the present invention.

FIG. 30 shows sixth embodiment of an illuminating optical system for a projection exposure device according to the present invention. Like parts are shown by corresponding reference characters shown in the first embodiment, and its detailed explanation is omitted. In FIG. 30, reference numeral 56 is a light flux separating portion consisting of diffraction optical elements 66 and 76 of transmitting type. In the fourth and fifth embodiments, the diffraction optical element having small area is displaced on the side of the light source portion 1, and the diffraction optical element having large area is displaced on the side of the fly-eye lens 8, but in this sixth embodiment, the diffraction optical element 76 having large area is displaced on the side of the light source portion 1, and the lens 4 is displaced between the diffraction optical elements 76 and 66.

As shown in FIG. 31a (plan view), 31b (side view), the diffraction optical element 66 is provided at its one surface with a concentric ring pattern diffraction gratings 66a having equal interval and equal pitch, and its cross-sectional shape of is blazed for the light of special reflecting diffraction order, for example, +primary light. On the while, as shown in FIG. 32a (plan view), 32b (side view), the diffraction optical element 76 is made, for example, of quartz, and one surface of the diffraction optical element 76 is provided at its zonal region with a concentric diffraction grating 76a. The cross-sectional shape of the linear diffraction grating 76a is blazed for special reflecting diffraction ordered light, for example, −primary light. Moreover, The region 76b near center of the diffraction optical element 76 is punched out widely than the passing range of the illuminating light flux at the position of the diffraction optical element 76.

The flow of the illuminating light flux in the sixth embodiment is then explained with respect to FIG. 33.

Substantially parallel light flux 14 formed by the light source portion 1 is incident on the diffraction optical element 66. While the light flux generated from the mercury lamp 3 is extended through the region 76b of the diffraction optical element 76. As shown in FIG. 33 being the perspective view near the diffraction optical elements 66, 76, the illuminating light flux 14 incident on the diffraction optical element 66 is reflected and diffracted by the diffraction grating 66s of the diffraction optical element 66 and is converted into the zonal illuminating light flux 15. Then, the zonal illuminating light flux is reflected and diffracted by the linear diffraction grating 76a of the diffraction optical element 76, thereby forming a collimated light flux in the direction parallel to the optical axis, and then incident on the fly-eye lens 8. The flow of the light flux thereafter is the same as that of the fourth embodiment, so that its detailed explanation is omitted.

Figure 34:
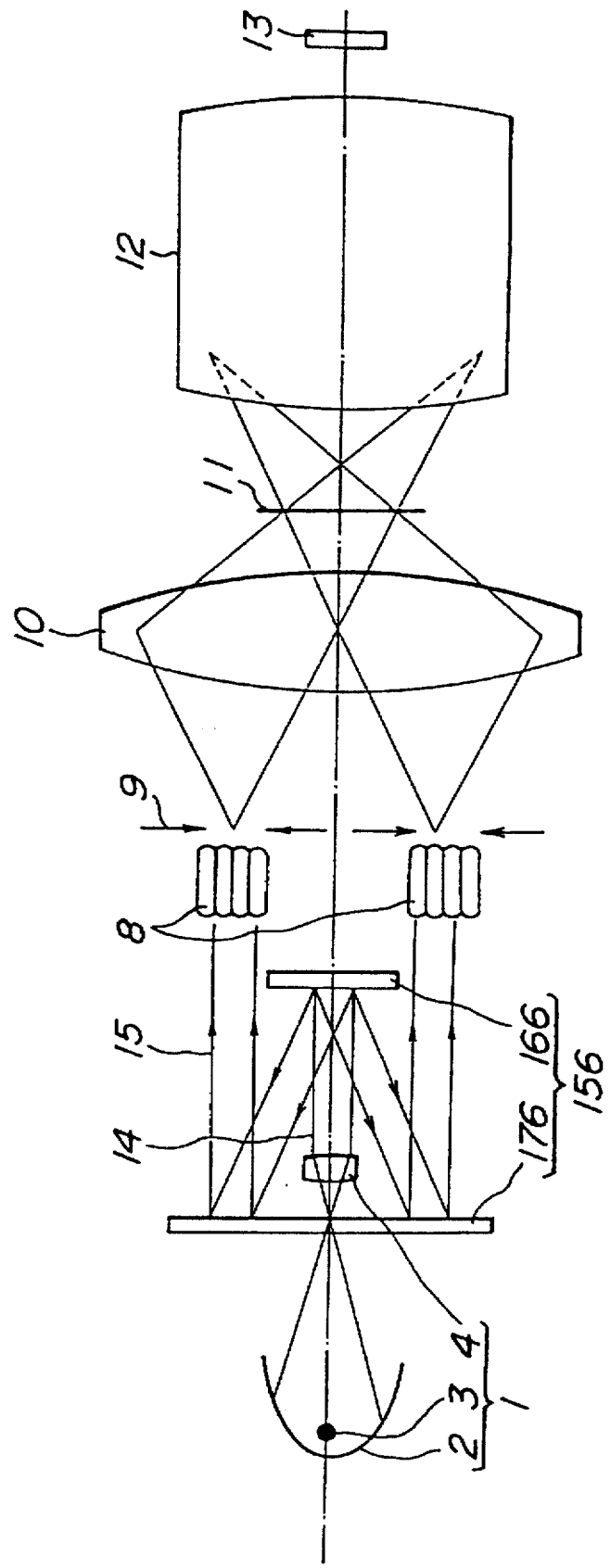
FIG. 34 is an explanatory view showing an another construction of sixth embodiment of an illuminating optical system for a projection exposure device according to the present invention.
Figure 38:
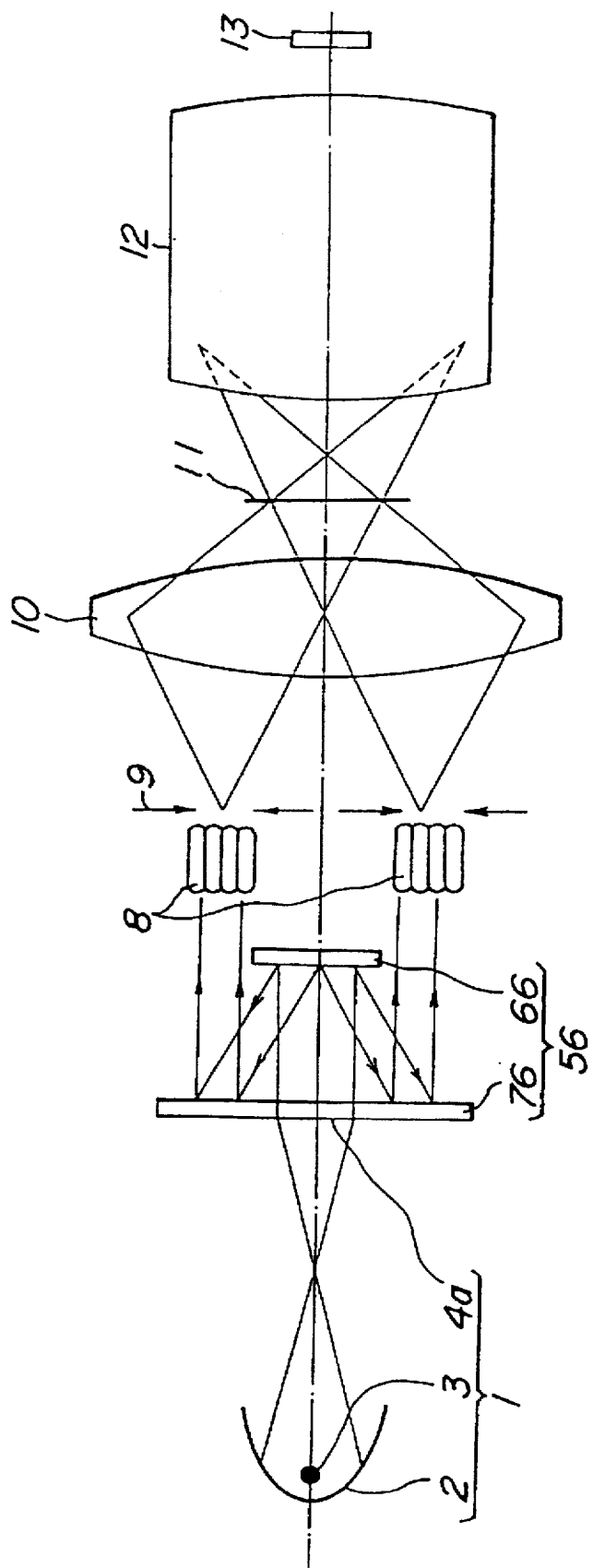
FIG. 38 is an explanatory view showing a projection exposure device corresponding to FIG. 37.
Figure 42:
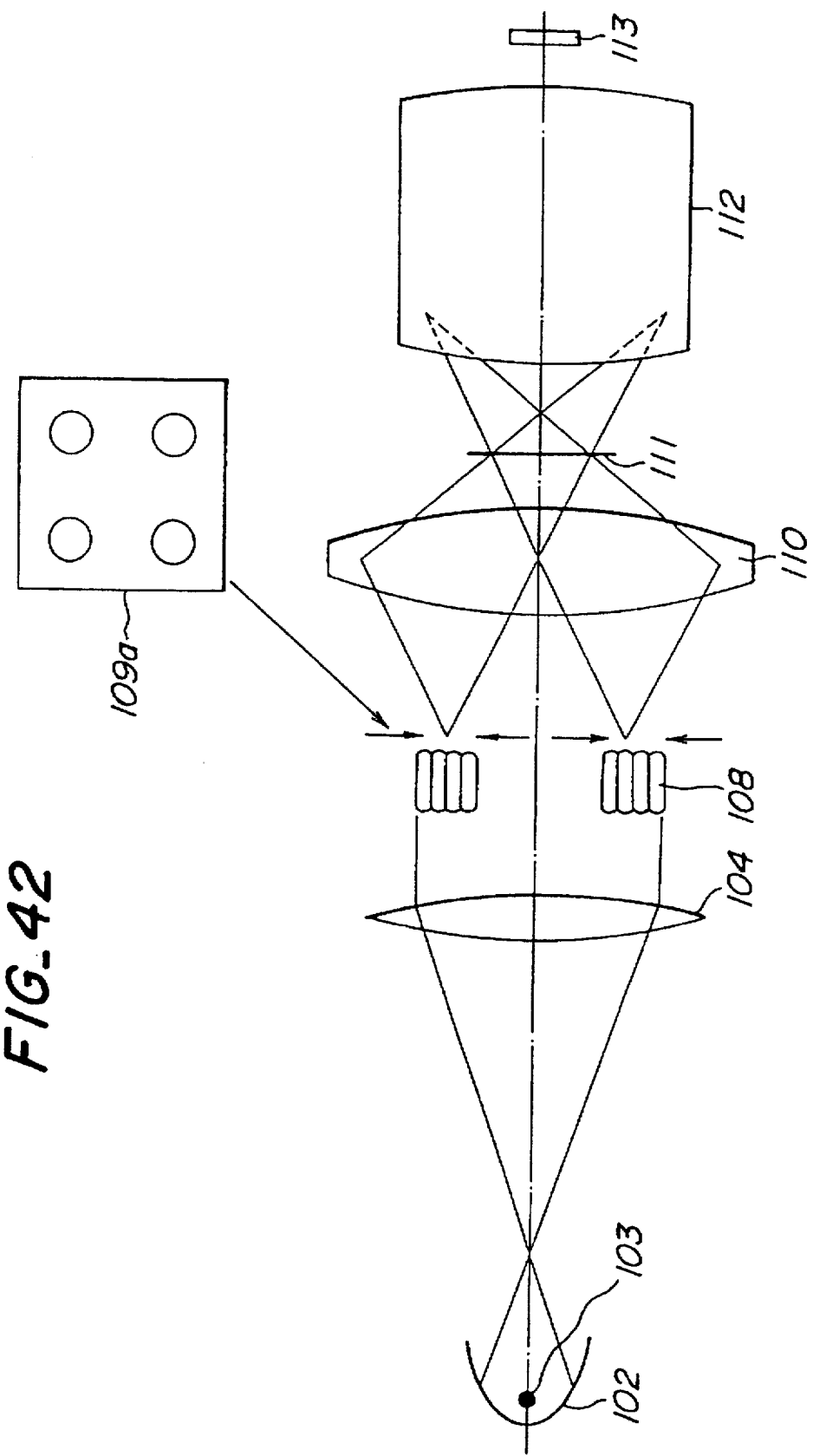
FIG. 42 is an explanatory view showing a conventional illuminating optical system.
Figure 43:
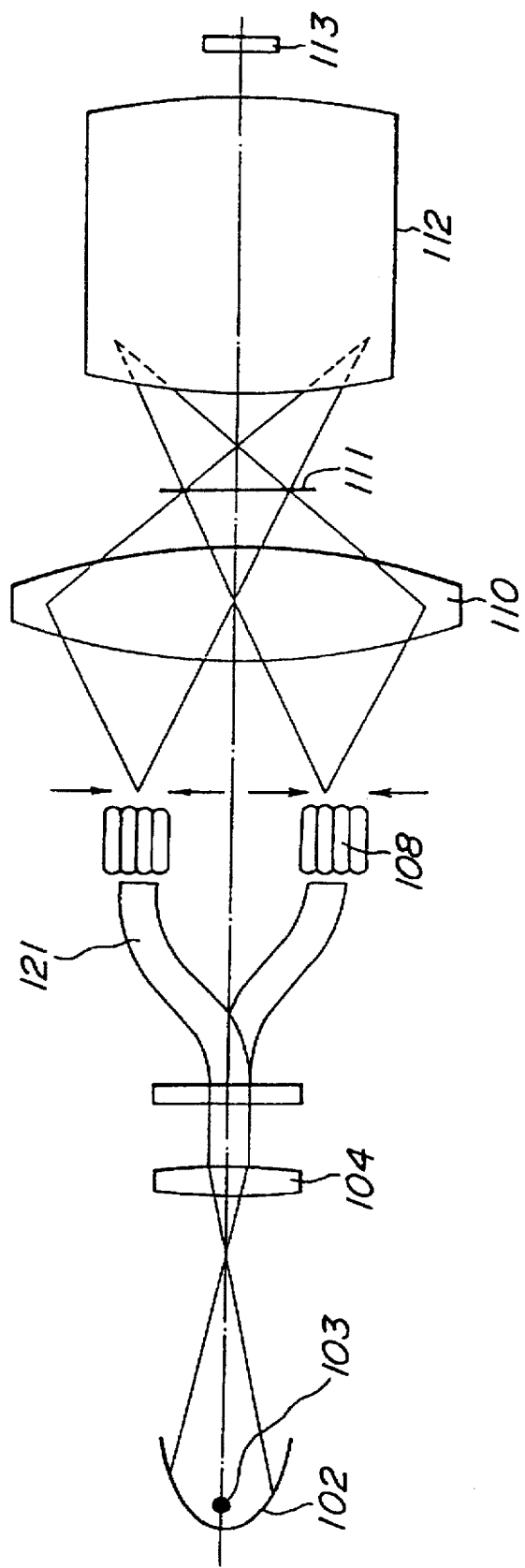
FIG. 43 is an explanatory view showing a conventional illuminating optical system.
Figure 44:
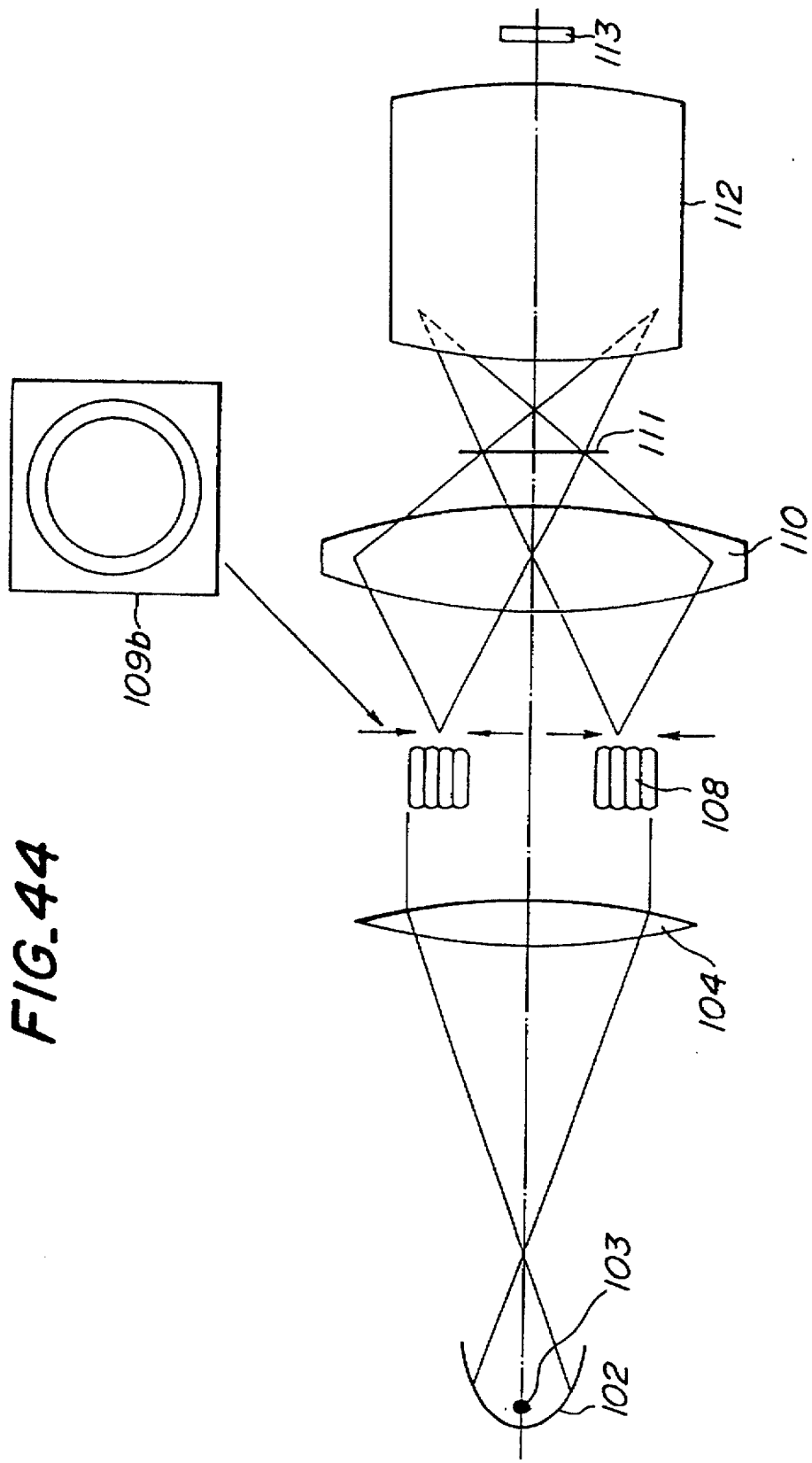
FIG. 44 is an explanatory view showing a conventional illuminating optical system.
Figure 45:
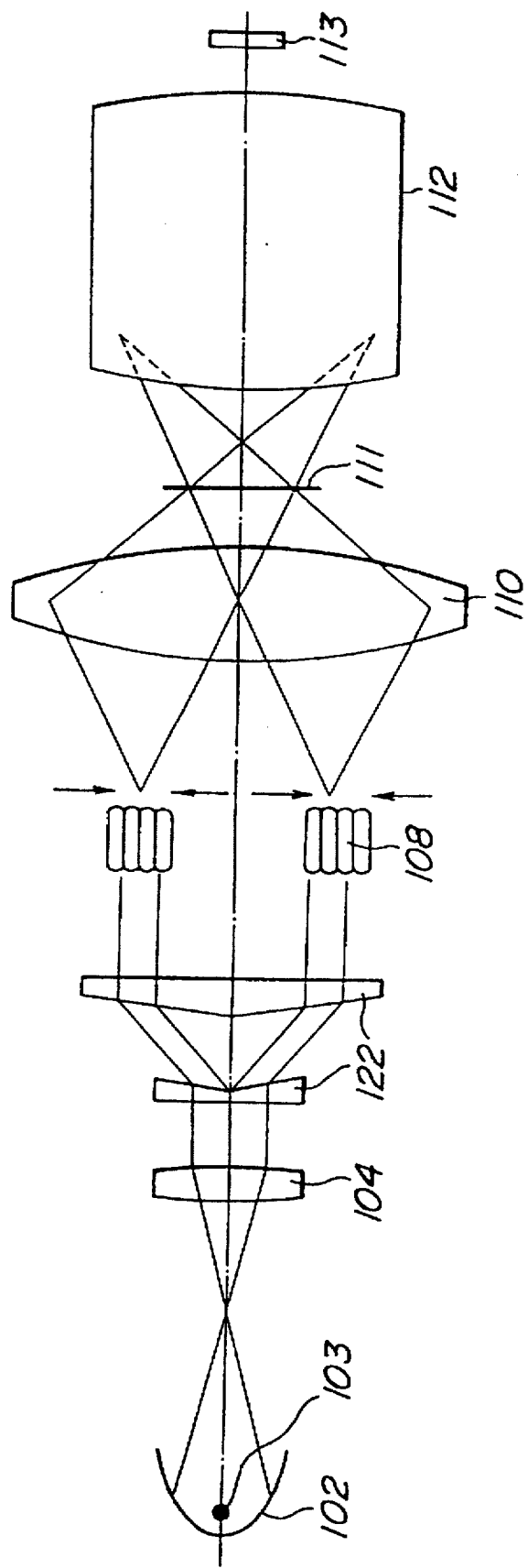
FIG. 45 is an explanatory view showing a conventional illuminating optical system.

In the sixth embodiment, as shown in FIG. 34, the optical system can be modified. In this case, the light flux separating portion is changed by a light flux separating portion 156 consisting of diffraction optical elements 166, 176. As shown in FIG. 35a (plan view), 35b (side view), the diffraction optical element 166 is provided at its one surface with a concentric ring pattern diffraction grating 166a having equal interval and equal pitch, and its cross-sectional shape is a rectangular shape having a duty ratio of 1:1, and its depth $t_4$ is so optimized that the diffraction efficiencies of +primary reflected diffraction light and −primary reflected diffraction light become equal and maximum. In this case, the depth $t_4$ is as follows.

$$t_4 = \lambda/4$$

Herein, λ is a wavelength of the light from the light source. As shown in FIG. 36a (plan view), 36b (side view), the diffraction optical element 176 is provided at the zonal region on one surface thereof with a concentric ring pattern diffraction grating 176a having equal interval and equal pitch, and its cross-sectional shape is blazed for special reflection diffraction ordered light, for example, a primary light. The diffraction optical element 176 is coated by an anti-reflection film (not shown) for the wavelength of the light of the light source at a region 176b near the center portion thereof.

In the case of the construction shown in FIG. 34, the flow of the illuminating light flux is as follows. That is, in the same manner as the above, the illuminating light flux 14 incident on the diffraction optical element 176 is reflected and diffracted by the diffraction grating 166a of the diffraction optical element 166, thereby forming a zonal illuminating light flux 15 by the reflected and diffracted +primary light and −primary light. In this case, the function of the diffraction grating 166a is fundamentally the same as that of the fifth embodiment except of a different point of reflection type and transmitting type. Thereafter, the zonal illuminating light flux 15 is incident on the diffraction optical element 176 and reflected and diffracted. The reflected and diffracted zonal illuminating light flux 15 is converted and collimated to a light flux substantially parallel to the optical axis, and then incident on the fly-eye lens 8. The flow of the light flux thereafter is the same as that of the fourth embodiment, so that its detailed explanation is omitted.

In this sixth embodiment, two diffraction optical element of reflection type is used as a light flux separating optical element to fold the optical path, so that the length of the projection exposure device in the direction of optical axis can be decreased.

In this sixth embodiment, instead of the lens 4, as shown in FIG. 37, the diffraction grating 4a of transmitting type having the same function as that of the lens 4 can be provided at the center portion of the diffraction optical element 76 to give the function of the lens 4 to a diffraction optical element 72, thereby uniforming the lens 4 and the diffraction optical element 72, so that the number of the components can be decreased and the alignment thereof becomes easy.

FIG. 39 shows seventh embodiment of an illuminating optical system for a projection exposure device according to the present invention. Like parts are shown by corresponding reference characters shown in the first embodiment, and its detailed explanation is omitted. In FIG. 39, reference numeral 67 consist of, for example, quartz, and as shown in FIG. 40a (plan view), 40b and 40c (side view), its one surface is provided with a diffraction grating 67a. The diffraction grating 67a is so constructed that in a plurality of square regions defined by straight lines having equal intervals drawn in raw and column directions as a plotting paper, the height of hatched square portions shown in FIG. 40a becomes higher than that of the other square portions by a height $t_5$. When viewed in the directions parallel to the straight lines having equal intervals extending in raw and column directions, the cross-sectional shape of the linear diffraction grating has a rectangular shape of a duty ratio of 1:1, and its depth $t_5$ is so optimized that a sum value of diffraction efficiency of +primary diffraction light and −primary diffraction light becomes maximum.

The light flux deflection member 16 is made of, for example, quartz, and one surface thereof is provided, at its four regions having equal intervals separated to each other corresponding to +primary light, −primary light from the diffraction optical element 67, with a linear diffraction grating 16a having equal intervals. The cross-sectional shape of the linear diffraction grating 16a is blazed for special diffraction ordered light, for example, the primary light.

The flow of the illuminating light flux in the third embodiment is then explained.

The light flux incident on the diffraction optical element 67 is diffracted by the diffraction grating 67a, and in the x direction shown in FIG. 40, is separated to +primary light, −primary light and other ordered lights, and in the y direction, and also separated to +primary light, −primary light and other ordered lights, so that the incident light is separated into a plurality of light fluxes as shown in FIG. 41. In FIG. 41, (1,0) shows that the light in x direction is primary diffraction light, and the light in y direction is zero ordered diffraction light. Four light fluxes 15 of the +primary light and −primary light in both x and y directions are incident on the four linear diffraction gratings 16a formed on the light flux deflection member 16, respectively. The light flux 15 incident on the linear diffraction grating 16a is inverted and collimated in the direction parallel to the optical axis.

In this seventh embodiment, the diffraction optical element of the rectangular cross-sectional shape having a duty ratio of 1:1 is used as a light flux separating optical system, so that it is not necessary to blaze the cross-sectional shape of the linear diffraction grating, and thus its manufacture becomes easy. Therefore, as a manufacturing method of the diffraction optical elements 67, the conventional method, for example, a method of manufacturing the above rectangular shape by for example the photolithography technique and the dry etching technique can be used. Moreover, since the diameter of the light flux is not changed by the diffraction optical element 67, if four light fluxes having the same diameter are formed finally, the diameter of the light flux 14 can be made ½, and thus the lens 4 can be made near the light source, as compared with the first embodiment in which the illuminating light flux is divided into four at wavefront, thereby making whole length of the illuminating optical system short. In the seventh embodiment, also, two diffraction surfaces are unified finally, so that as compared with the third embodiment, in which the +primary light and the −primary light are used in the same manner as the above, the manufacturing steps can be decreased in case of manufacturing the diffraction optical element.

In this seventh embodiment, the blazed diffraction optical element is used as a light diffracting member, other members such as four triangle prisms and mirrors or the like can be used instead thereof, to obtain the same effects. However, if the diffraction optical element shown in FIG. 18 is used, the light flux deflecting member can be uniformly formed, so that the alignment becomes easy and the device can be manufactured inexpensively.

According to the present invention as described above, the diffraction optical element is used in order to separate the illuminating light flux into four, and to convert the illuminating light flux to the zonal flux, so that the construction becomes simple and the mechanical reliability becomes increased. Moreover, the manufacture of the diffraction grating may utilize the conventional method, so that the realization thereof is easy. In addition thereto, the illuminating light flux can be utilized with high efficiency, so that the utilization efficiency of the light from the light source becomes high.

What is claimed is:

1. An illuminating optical system for use in a projection exposure device comprising:

a light source, a light flux separating optical system for separating a light flux of light from the light source, and a condenser optical system for leading the light flux separated by the light flux separating optical system on a reticle, said light flux separating optical system and said condenser optical system being provided in turn along a traveling direction of light emitted by said light source, said light flux separating optical system including at least one diffraction optical means having at least one linear grating pattern for separating the light flux of said light from the light source into four light fluxes.

2. An illuminating optical system for use in a projection exposure device as claimed in claim 1, wherein the light-flux separating system comprises:

a first diffraction optical surface having a linear grating pattern in a cross-sectional form so as to make diffraction efficiencies of $+m_1$ order diffraction light and $-m_1$ order diffraction light substantially equal, and a second diffraction optical surface comprising:

a first diffraction region separated from the first diffraction optical surface in the optical axis direction of the illuminating optical system, and on which the $+m_1$ order diffraction light caused by the first diffraction optical surface is incident, the first diffraction region having a cross-sectional shape of diffraction efficiencies of $m_2$ order diffraction light and $-m_2$ order diffraction light being substantially equal, and having a linear grating pattern in the grating direction orthogonal to that of the first diffraction optical surface; and a second diffraction region on which the $-m_1$ order diffraction light caused by the first diffraction optical surface is incident, the second diffraction region having a cross-sectional shape of diffraction efficiencies of $+m_3$ order diffraction light and $-m_3$ order diffraction light being substantially equal, and having a linear grating pattern in the grating direction orthogonal to that of the first diffraction optical surface, wherein $m_1$, $m_2$, $m_3$ are arbitrary integers.

3. An illuminating optical system as claimed in claim 1, wherein the light flux separating optical system comprises a diffraction optical element including substantially square regions having different depths displaced to each other in a checkwise configuration.

4. An illuminating optical system as claimed in claim wherein $m_1=m_2=m_3=1$.

5. An illuminating optical system for use in a projection exposure device comprising a light source, a light flux separating optical system for converting a light flux from the light source to a zonal light flux, a condenser optical system for leading the zonal light flux converted by the light flux separating optical system on a reticle, and a diffraction optical means included in the light flux separating optical system and having a concentric ring grating pattern.

6. An illuminating optical system for use in a projection exposure device as claimed in claim 5, wherein the concentric ring grating pattern of the diffraction optical means has grating pitches of substantially equal intervals and channel cross-sectional shape blazed for the wavelength of the light flux of the light incident on the diffraction optical means from the light source.

7. An illuminating optical system for use in a projection exposure device as claimed in claim 5, wherein the diffraction optical means comprises a diffraction optical element having grating pitches of the concentric ring grating pattern being substantially equal intervals and having a channel cross-sectional shape of diffraction efficiencies of $+m_1$ ordered diffraction light and $-m_1$ ordered diffraction light being substantially equal, wherein $m_1$ is optional natural number.

8. An illuminating optical system comprising:
a light source; and
a light flux separating optical system for separating a light flux of light from the light source into four light fluxes;
said light flux separating optical system including at least one diffraction optical means having a linear grating pattern.

9. An illuminating optical system for use in a projection exposure device comprising:
a light source; and
a light flux separating optical system for separating a light flux of light from the light source into four light fluxes;
said light flux separating optical system including at least one diffraction optical means having a linear grating pattern.

10. An illuminating optical system as claimed in claim 9, wherein said light flux separating optical system includes a first diffraction optical means having a first linear grating pattern and a second linear grating pattern substantially vertical thereto.

11. An illuminating optical system as claimed in claim 10, wherein said first diffraction optical means is a transmission type diffraction grating.

12. An illuminating optical system as claimed in claim 11, wherein said transmission type optical diffraction grating has blazed cross-sectional shape.

13. An illuminating optical system as claimed in claim 10, wherein said first diffraction optical means is a reflection type diffraction grating.

14. An illuminating optical system as claimed in claim 13, wherein said reflection type diffraction grating has a blazed cross-sectional shape.

15. An illuminating optical system as claimed in claim 10, wherein said first and second linear grating patterns are formed on a same optical element.

16. An illuminating optical system as claimed in claim 15, wherein said first and second linear grating patterns are formed on a same surface of the same optical element.

17. An illuminating optical system as claimed in claim 15, wherein the diffraction optical means comprises four areas of said linear grating pattern, said four areas being disposed such that in interface thereof is in a substantially cross-shaped configuration, and have a diffraction pitch of substantially equal intervals, and are so constructed that grating directions of the four areas of said linear grating pattern adjacent to each other are substantially orthogonal.

18. An illuminating optical system as claimed in claim 17, wherein said first diffraction optical means is a reflection type diffraction grating.

19. An illuminating optical system as claimed in claim 18, wherein said reflection type diffraction grating has a blazed cross-sectional shape.

20. An illuminating optical system as claimed in claim 17, wherein said diffraction optical means is a transmission type diffraction grating.

21. An illuminating optical system as claimed in claim 20, wherein said transmission type diffraction grating has a blazed cross-sectional shape.

22. An illuminating optical system as claimed in claim 17 or 10, wherein said light flux separating optical system includes a second diffraction optical means for making the four light fluxes separated by said diffraction optical means into substantially collimated light fluxes.

23. An illuminating optical system as claimed in claim 22, wherein said second diffraction optical means has linear grating patterns corresponding to the respective four light fluxes emanated from said first diffraction optical means.

24. An illuminating optical system as claimed in claim 23, wherein said first diffraction optical means and said second diffraction optical means are formed on two surfaces arranged by separating them in an optical axis direction.

25. An illuminating optical system as claimed in claim 24, wherein said first diffraction optical means and said second diffraction optical means are formed on an incident surface and an emanating surface of an optical block, respectively.

26. An illuminating optical system as claimed in claim 23, wherein said first and second diffraction optical means are of a transmission type diffraction grating.

27. An illuminating optical system as claimed in claim 26, wherein said transmission type diffraction grating has a blazed cross-sectional shape.

28. An illuminating optical system as claimed in claim 23, wherein said first and second diffraction optical means are of a reflection type diffraction grating.

29. An illuminating optical system as claimed in claim 28, wherein said reflection type grating has a blazed cross-sectional shape.

30. An illuminating optical system as claimed in claim 29, wherein said second diffraction optical means includes an area that functions as a diffractive lens for collimating the light flux from the light source.

* * * * *

UNITED STATES PATENT AND TRADEMARK OFFICE
CERTIFICATE OF CORRECTION

PATENT NO. : 5,695,274
DATED : December 9, 1997
INVENTOR(S) : Yasuhiro Kamihara et al.

It is certified that error appears in the above-identified patent and that said Letters Patent is hereby corrected as shown below:

Please add the priority information as follows:

--Foreign Application Priority Data - March 23, 1994 [JP] Japan 06-051609--

Signed and Sealed this

Seventeenth Day of July, 2001

*Attest:*

*Attesting Officer*

NICHOLAS P. GODICI
*Acting Director of the United States Patent and Trademark Office*